United States Patent
Nguyen et al.

(10) Patent No.: US 9,853,679 B2
(45) Date of Patent: Dec. 26, 2017

(54) MEMS-BASED REGENERATIVE TRANSCEIVER

(71) Applicant: THE REGENTS OF THE UNIVERSITY OF CALIFORNIA, Oakland, CA (US)

(72) Inventors: Clark T.-C. Nguyen, Oakland, CA (US); Tristan O. Rocheleau, Berkeley, CA (US); Thura Lin Naing, Berkeley, CA (US)

(73) Assignee: THE REGENTS OF THE UNIVERSITY OF CALIFORNIA, Oakland, CA (US)

( * ) Notice: Subject to any disclaimer, the term of this patent is extended or adjusted under 35 U.S.C. 154(b) by 0 days.

(21) Appl. No.: 15/354,110

(22) Filed: Nov. 17, 2016

(65) Prior Publication Data

US 2017/0141810 A1 May 18, 2017

Related U.S. Application Data

(63) Continuation of application No. PCT/US2015/031589, filed on May 19, 2015.
(Continued)

(51) Int. Cl.
*H04B 1/38* (2015.01)
*H04B 1/40* (2015.01)
(Continued)

(52) U.S. Cl.
CPC ............. *H04B 1/40* (2013.01); *H03H 9/2426* (2013.01); *H03H 9/2431* (2013.01);
(Continued)

(58) Field of Classification Search
CPC . H04B 1/40; H04L 27/12; H03H 9/25; H03H 9/2426; H03H 9/2431; H03H 9/2436; H03H 9/2447
(Continued)

(56) References Cited

U.S. PATENT DOCUMENTS 6,946,921 B1  9/2005  Shaeffer
8,686,802 B1  4/2014  Brown et al.
(Continued)

OTHER PUBLICATIONS

Korean Intellectual Property Office (KIPO), International Search Report and Written Opinion, dated Aug. 28, 2015, related PCT international application No. PCT/US2015/031589, pp. 1-10, with claims searched, pp. 11-19.

*Primary Examiner* — Ayodeji Ayotunde
(74) *Attorney, Agent, or Firm* — O'Banion & Ritchey LLP; John P. O'Banion

(57) ABSTRACT

A radio frequency (RF) MEMS resonator is embedded in an active positive feedback loop to form a tunable RF channel-selecting radio transceiver employing a super-regenerative reception scheme. This transceiver harnesses the exceptionally high Q (around 100,000) and voltage-controlled frequency tuning of a resonator structure to enable selection of any one of among twenty 1 kHz wide RF channels over an 80 kHz range, while rejecting adjacent channels and consuming <490 μW. Such transceivers are well suited to wireless sensor node applications, where low-power and simplicity trump transmission rate. Electrical stiffness-based frequency tuning also allows this same device to operate as a frequency shift keyed (FSK) transmitter, making a complete transceiver in one simple device. Finally, the geometric flexibility of resonator structure design should permit a large range of usable RF frequencies, from the presently demonstrated 60.6-MHz VHF, all the way up to UHF.

44 Claims, 15 Drawing Sheets

Related U.S. Application Data

(60) Provisional application No. 62/000,457, filed on May 19, 2014.

(51) Int. Cl.
  *H03H 9/24* (2006.01)
  *H03H 9/25* (2006.01)
  *H04L 27/12* (2006.01)

(52) U.S. Cl.
  CPC ........ *H03H 9/2436* (2013.01); *H03H 9/2447* (2013.01); *H03H 9/25* (2013.01); *H04L 27/12* (2013.01)

(58) Field of Classification Search
  USPC .......................................... 455/73
  See application file for complete search history.

(56) References Cited

U.S. PATENT DOCUMENTS

| | | | |
|---|---|---|---|
| 2002/0145489 A1* | 10/2002 | Cornett | H03H 3/007 333/197 |
| 2009/0016548 A1* | 1/2009 | Monat | H03D 11/00 381/111 |
| 2011/0025426 A1 | 2/2011 | Steeneken et al. | |
| 2011/0150031 A1 | 6/2011 | Abdelmoneum et al. | |
| 2011/0193641 A1 | 8/2011 | Clark et al. | |

\* cited by examiner

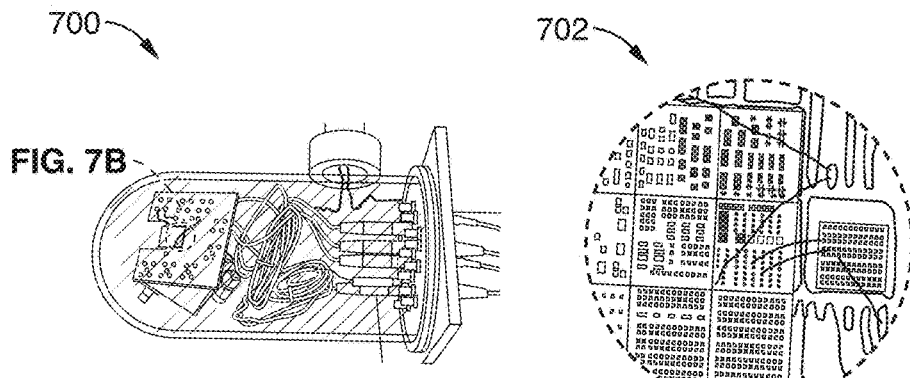
FIG. 7A
FIG. 7B
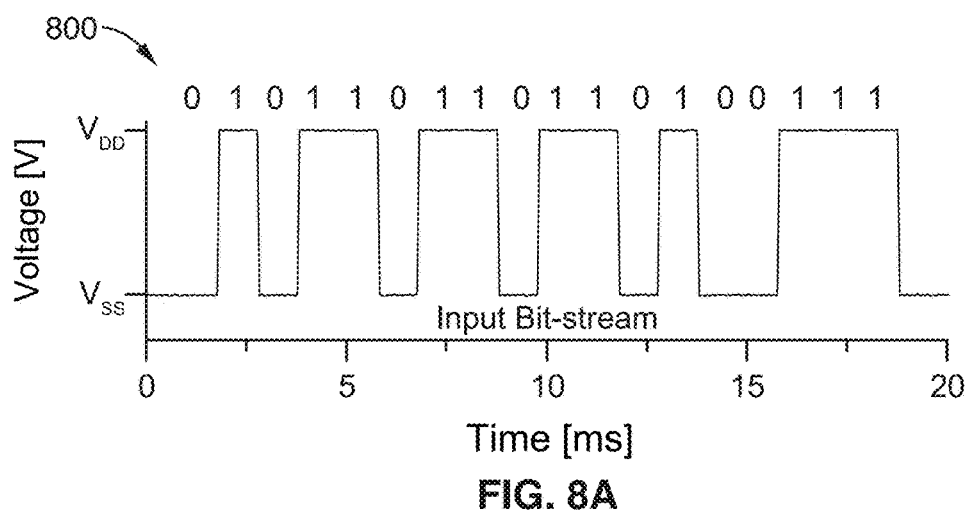
FIG. 8A
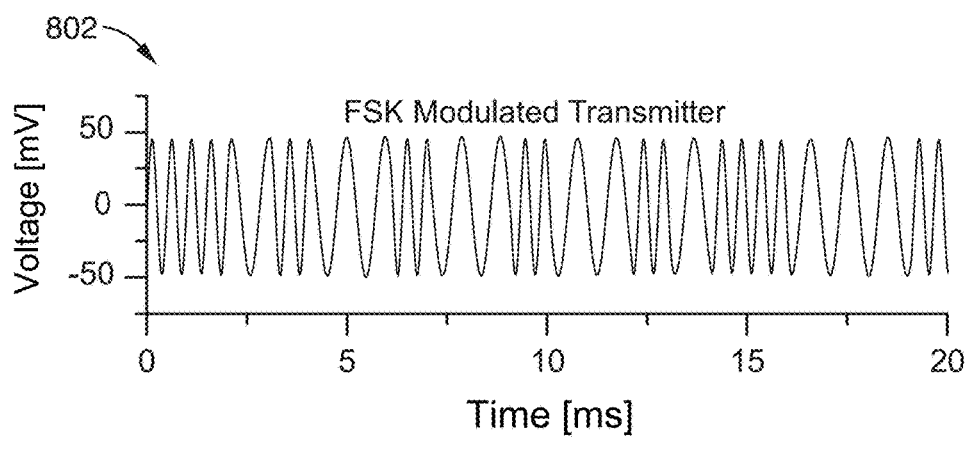
FIG. 8B

MEMS-BASED REGENERATIVE TRANSCEIVER

CROSS-REFERENCE TO RELATED APPLICATIONS

This application is a 35 U.S.C. §111(a) continuation of PCT international application number PCT/US2015/031589 filed on May 19, 2015, incorporated herein by reference in its entirety, which claims priority to, and the benefit of, U.S. provisional patent application Ser. No. 62/000,457 filed on May 19, 2014, incorporated herein by reference in its entirety. Priority is claimed to each of the foregoing applications.

The above-referenced PCT international application was published as PCT International Publication No. WO 2015/179407 on Nov. 26, 2015, which publication is incorporated herein by reference in its entirety.

STATEMENT REGARDING FEDERALLY SPONSORED RESEARCH OR DEVELOPMENT

This invention was made with Government support under W31P4Q-09-1-0006 awarded by the Defense Advanced Research Projects Agency (DARPA). The Government has certain rights in the invention.

INCORPORATION-BY-REFERENCE OF COMPUTER PROGRAM APPENDIX

Not Applicable

NOTICE OF MATERIAL SUBJECT TO COPYRIGHT PROTECTION

A portion of the material in this patent document is subject to copyright protection under the copyright laws of the United States and of other countries. The owner of the copyright rights has no objection to the facsimile reproduction by anyone of the patent document or the patent disclosure, as it appears in the United States Patent and Trademark Office publicly available file or records, but otherwise reserves all copyright rights whatsoever. The copyright owner does not hereby waive any of its rights to have this patent document maintained in secrecy, including without limitation its rights pursuant to 37 C.F.R. §1.14.

BACKGROUND

1. Technical Field

The technology of this disclosure pertains generally to regenerative transceivers, particularly to regenerative transceivers utilizing a resonant structure as a filter element, and still more particularly to regenerative transceivers utilizing a resonant structure as a filter element within an amplified positive feedback loop.

2. Background Discussion

Regenerative transceivers in most designs use isolation amplifiers to decouple an input antenna from the loop amplifier. Such isolation amplifiers require substantial power, ruling them out for ultra low power (<1-5 µW) transceiver applications.

BRIEF SUMMARY

Power consumption remains an important consideration in the design of ubiquitous sensor nodes. With the increase in the number of such nodes expected, it is unlikely that batteries or other power supplies would be replaceable. Hence, ever lower power requirements are needed.

Often, a dominant source of power consumption in sensor devices is RF communications. By reducing component part count, and simplifying data communication complexity, power consumption may be lowered.

Here, a radio frequency (RF) MEMS resonator is embedded in an active positive feedback loop to form a tunable RF channel-selecting radio transceiver employing a super-regenerative reception scheme. The resulting transceiver utilizes the high Q (1,000-100,000) and voltage-controlled frequency tuning possible in MEMS resonators to enable direct selection of a single narrow RF channel in a broader band, as desired for low power operation.

Use of one or more ports of the MEMS filter element as signal inputs with separate sets of electrodes for the regenerative gain effects a filtering that suppresses input signal feed through, thereby allowing a cleaner filtered output. If differential input signals are used, this removal of feed through can be further enhanced. Past regenerative receivers using conventional technology could only use two-port devices wired in feedback with an amplifier. This meant that the input signal had to be directly connected to the input of the amplifier, which results in anything entering the system (such as through an antenna) to be amplified without any filtering whatsoever. If there are large interferers at frequencies other than the desired frequency (which there always are for radio applications), then such interferers cause major issues and often prevent reception. With the multiple isolated electrodes possible using MEMS technology, such inputs can be isolated from the amplifier, thus solving this problem.

Such RF-MEMS transceivers are well suited to wireless sensor node applications, where low-power and simplicity trump transmission rate. Electrical stiffness-based frequency tuning also allows this same device to operate as a frequency shift keyed (FSK) transmitter, or with simple switching of the output, an on-off keying (OOK) transmitter, making a complete transceiver in one exceedingly simple device. Finally, the geometric flexibility of resonator structure design should permit a large range of usable RF frequencies, from the presently demonstrated 60.6-MHz VHF, all the way up to UHF.

Further aspects of the technology described herein will be brought out in the following portions of the specification, wherein the detailed description is for the purpose of fully disclosing preferred embodiments of the technology without placing limitations thereon.

BRIEF DESCRIPTION OF THE SEVERAL VIEWS OF THE DRAWING(S)

The technology described herein will be more fully understood by reference to the following drawings which are for illustrative purposes only:

FIG. 7A is photograph of one measurement setup embodiment including the regenerative transceiver dies mounted on a printed circuit board (PCB) and measured in a bell-jar vacuum environment.

FIG. 7B is an enlargement of a portion of the photograph of FIG. 7A, where the MEMS and ASIC dies is shown, with both devices fabricated with many devices on a single die (e.g. one or more), one each wire bonded to the PCB.

FIG. 8A is a graph of measured receiver operation for a 1 kbps input bit-stream transmitted across a distance of 4 m as in FIG. 2 using a Binary FSK modulated transmitter with 1 kHz shift on a 60.6 MHz RF carrier, and output power of −17 dBm (20 µW).

FIG. 8B is a graph of the representative FSK modulated transmitter signal section of FIG. 8A that has been down-mixed to 2 kHz for viewing by using a bench-top signal generator.

DETAILED DESCRIPTION

Introduction

Figure 1A:
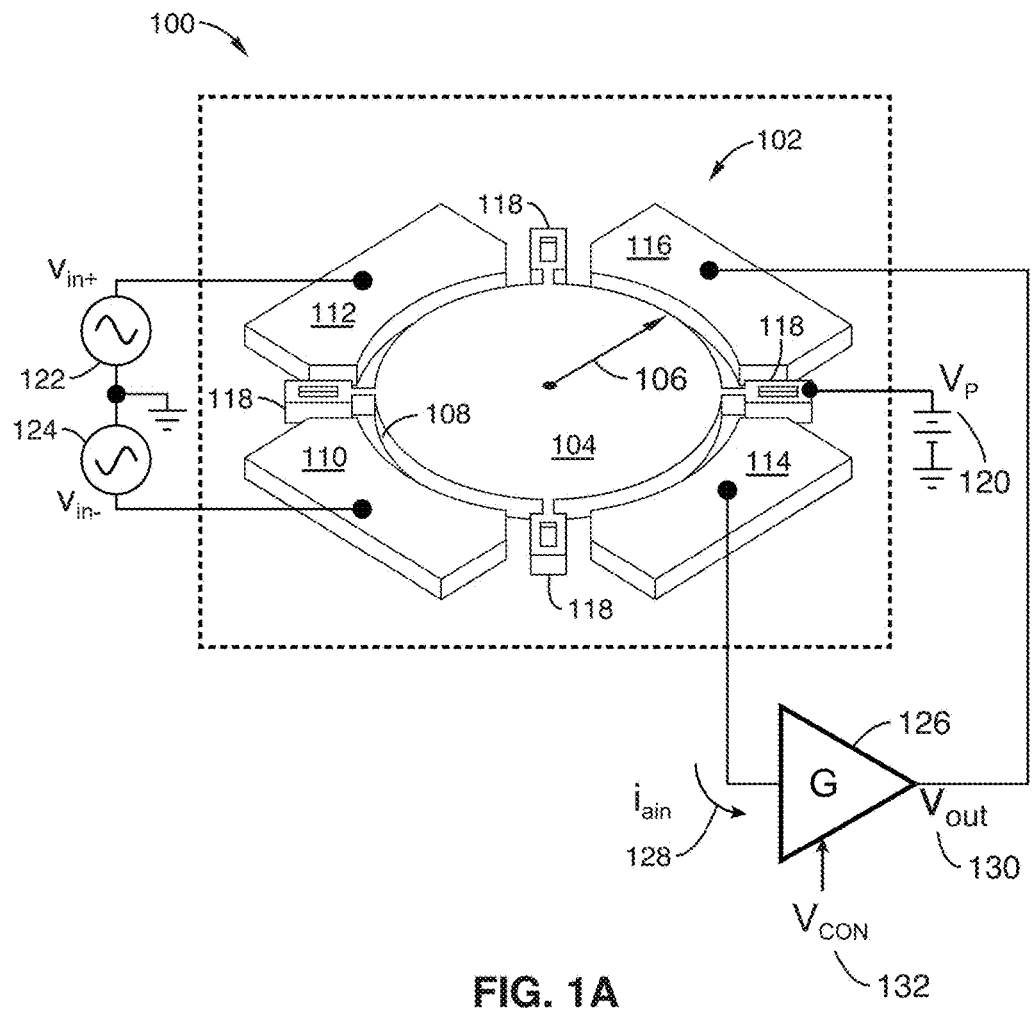
FIG. 1A is a perspective view of one embodiment of a resonator structure described herein.

The field of radio frequency (RF) microelectromechanical systems (MEMS) has thus far improved many aspects of wireless communication, with applications ranging from on-chip MEMS devices providing compact and low phase-noise reference oscillators, to band-selecting RF front-end duplexers. Greater potential remains, however, if the high quality factor and computer assisted drafting (CAD)-definable frequency possible in on-chip MEMS can be harnessed to achieve a true channel-selection scheme.

In particular, MEMS-based communication offers a viable path towards meeting the ultra-low-power requirements demanded by wireless sensor networks. Tiny, low-cost wireless motes, where on-board sensors collect and transmit data through a mesh network while operating only on scavenged or battery power, could stand to revolutionize data collection in applications ranging from industrial or environmental monitoring to biomedical imaging. While significant advances have been made towards such goals, the power consumption of current conventional-technology efforts are still in the milliwatt range, in excess of that needed for true set-and-forget sensor nodes.

On-chip MEMS devices have emerged as one option that provides the high quality factors (Q) and small parasitic capacitances that make possible narrow bands and low power operation. With Q>40,000 even at GHz frequencies, such resonators easily allow for the tightly-spaced kHz-frequency bands ideal for sensor nodes, without requiring the processing and power-hungry spread-spectrum approaches presently use. Indeed, power consumption of oscillators constructed from such resonators has been demonstrated at below 100 μW, even in the face of modest resonator impedance in the kΩ-range. These are ideally suited to the target wireless sensor node application, for which low-power and simplicity trump transmission rate.

Here, one embodiment is demonstrated of such an electromechanical circuit example that uses a capacitive-gap RF MEMS resonator that is embedded in a positive feedback loop with an Application-Specific Integrated Circuit (ASIC) Trans-Impedance Amplifier (TIA). This example has demonstrated a fully-functional MEMS-based tunable RF channel-selecting radio transceiver employing a super-regenerative reception scheme. Unlike other such super-regenerative receivers, this example harnesses the high Q factors (~100, 000) and voltage-controlled frequency tunability of its capacitive-gap transduced resonator structure to enable selection of any one of among twenty 1-kHz-wide RF channels over an 80-kHz range, while rejecting adjacent channels and consuming only 490 μW. Additionally, use of the multiple electrodes possible in such MEMS resonators allows isolation of out-of-channel interfering signals from the amplifier, relaxing linearity and hence power requirements of the amplifier, a marked improvement over past receivers.

This electrical stiffness-based frequency tuning additionally allows the same MEMS-ASIC system to operate as an FSK transmitter, enabling a complete transceiver in one simple device. Operated as a closed-loop oscillator with FSK modulation enabled via an applied voltage on the MEMS input electrodes, this transmitter offers direct carrier generation at the RF frequency of interest without the power-hungry complexity of previous phase locked loop (PLL)-based MEMS transmitters. While this tuning is achieved in the demonstrated embodiment using electrical stiffness, one of ordinary skill in the art will appreciate that other methods of tuning possible in MEMS resonators could be equally. For example, use of a variable capacitance connected to one or more ports of the resonator could be used to shift frequency in a fashion similar to traditional quartz oscillators.

Refer now to FIG. 1A through FIG. 1I for an overview of a small non-limiting selection of embodiments of such a system.

FIG. 1A is a perspective view 100 of an example resonator structure 102 described herein. Here, the disk 104, of radius 32 μm 106 has a spacing of 65 nm 108 from electrodes 110, 112, 114, and 116. Anchors 118 (shown here in four places) support the disk 104. A tuning voltage $V_p$ 120 is applied through at least one anchor, biasing the disk 104 relative to the electrodes 110, 112, 114, and 116. A positive input voltage $V_{in+}$ 122 is applied to first electrode 112, and a negative input voltage $V_{in-}$ 124 is applied to a second electrode 110.

G 126 is a current to voltage transimpedance amplifier that takes an input current $i_{ain}$ 128 from a feedback input electrode 114, and converts it to an output voltage $V_{out}$ 130 that is applied to a feedback output electrode 116. A control voltage $V_{CON}$ 132 controls the operation of G 126, and may be used to controllably turn the amplifier 126 on or off.

The differential inputs, positive input voltage $V_{in+}$ 122 and negative input voltage $V_{in-}$ 124, are capacitively coupled to the resonator structure 102, thus allowing a high degree of common mode and off-resonance feed through rejection from the inputs to the feedback output electrode 116.

Figure 1B:
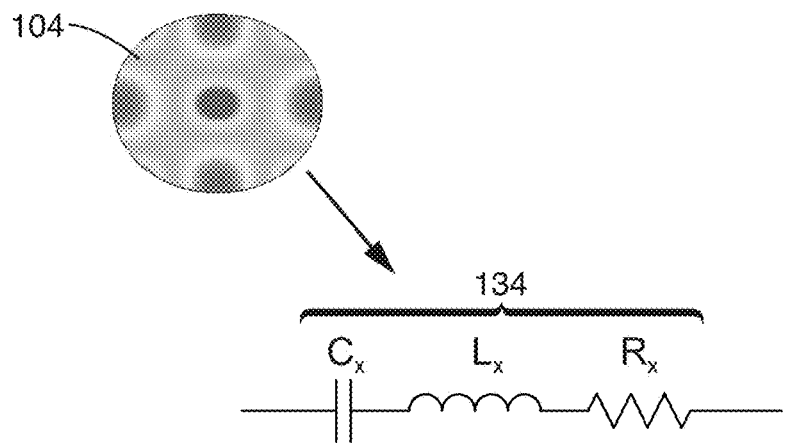
FIG. 1B is a modal deflection view of the resonator structure of FIG. 1A, with an equivalent electrical circuit shown.

FIG. 1B is a modal deflection view of the example disk 104 of FIG. 1A, with the equivalent electrical circuit shown comprising $C_x$, $L_x$, and $R_x$ 134 all in series.

Figure 1C:
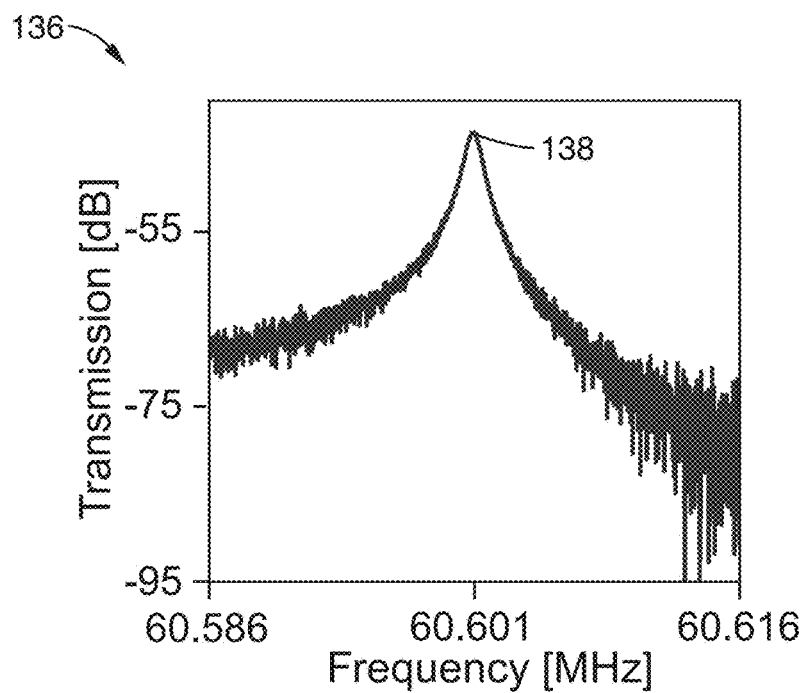
FIG. 1C is a plot of the signal transmission versus frequency of the resonator structure of FIG. 1A.

FIG. 1C is a plot 136 of the signal transmission versus frequency of the example resonator structure of 102 FIG. 1A. Here, the center frequency 138 is readily observed.

Figure 1D:
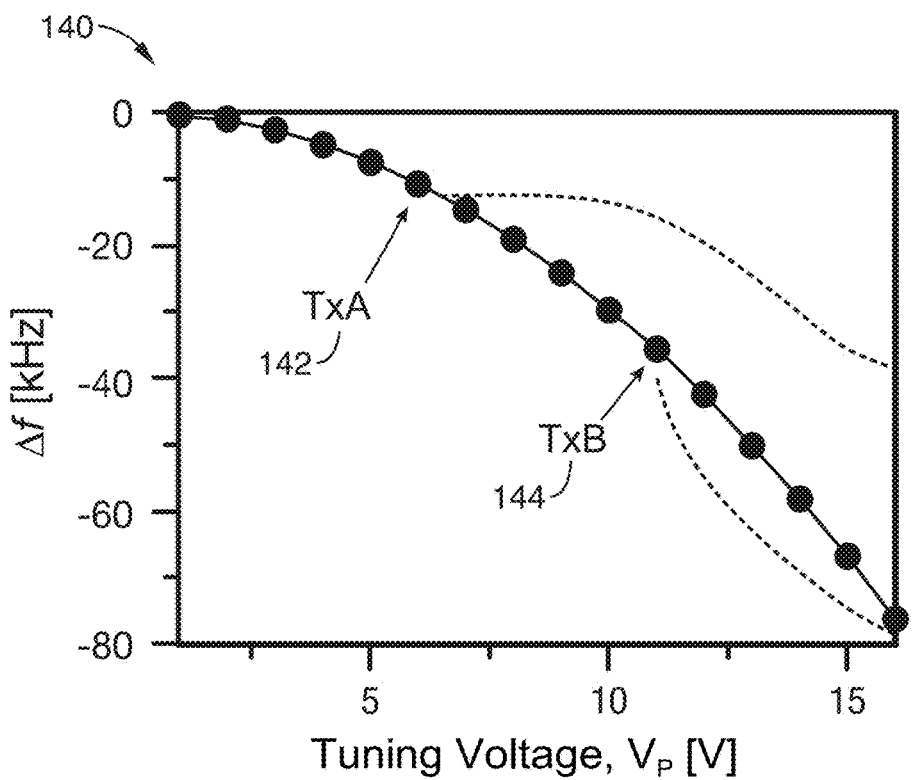
FIG. 1D is a plot of center turning frequency change versus applied tuning voltage of the resonator structure of FIG. 1A.

FIG. 1D is a plot 140 of center turning frequency change versus applied tuning voltage of the example resonator structure of FIG. 1A. In this plot 140, it is shown that the TxA channel 142 is selected with a Δf of about −10 kHz at $V_p$ of about 6 V. Similarly, the TxB channel 144 is selected with a Δf of about −38 kHz at $V_p$ of about 11 V.

Figure 1E:
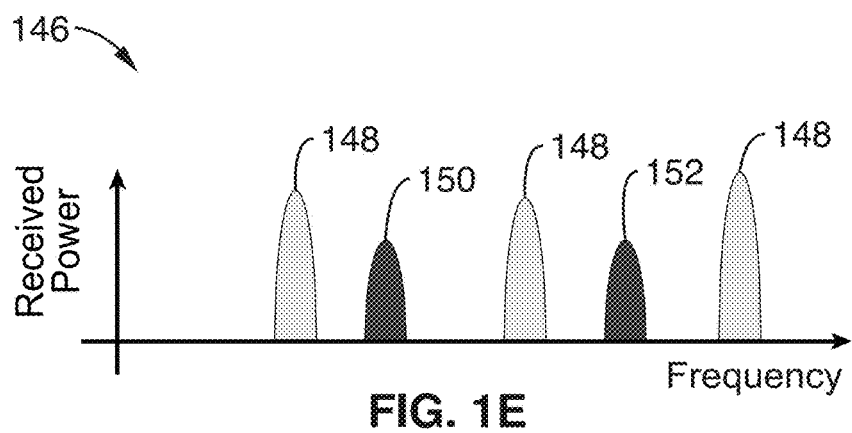
FIG. 1E is a plot of received power versus frequency of the resonator structure of FIG. 1A, indicating very close channel spacing.

FIG. 1E is a plot 146 of received power versus frequency of the example resonator structure of FIG. 1A, indicating very close channel spacing. Here, it appears that there are very close neighboring frequency signals 148 that may interfere with the transmission and reception of signals TxA 150 and TxB 152.

Figure 1F:
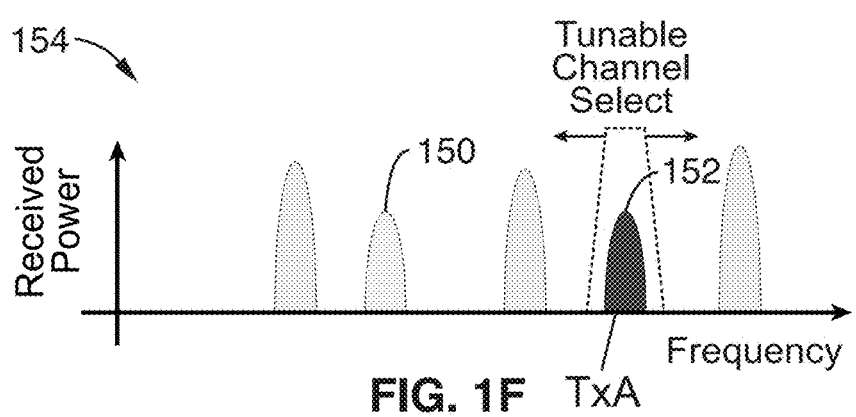
FIG. 1F is a plot of received power versus frequency of the resonator structure of FIG. 1A, indicating TxA channel selection.

FIG. 1F is a plot 154 of received power versus frequency of the example resonator structure of FIG. 1A, indicating TxA 152 channel selection. Here, it appears that the received TxA signal 152 is easily detected.

Figure 1G:
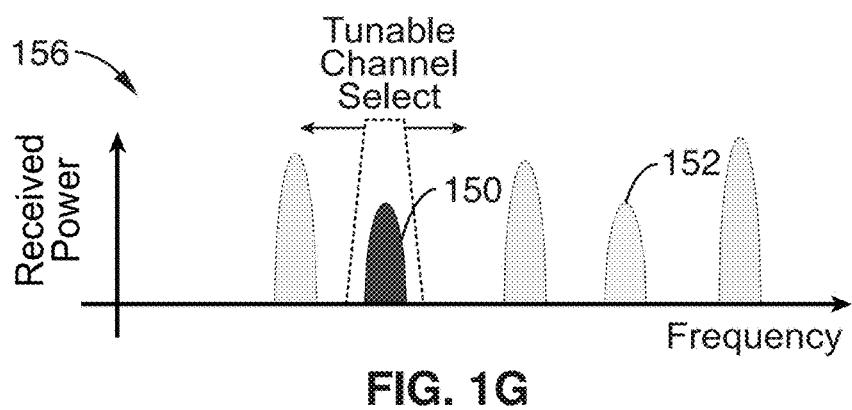
FIG. 1G is a plot of received power versus frequency of the resonator structure of FIG. 1A, indicating TxB channel selection.

FIG. 1G is a plot 156 of received power versus frequency of the example resonator structure of FIG. 1A, indicating TxB 150 channel selection is also easily detected.

Figure 1H:
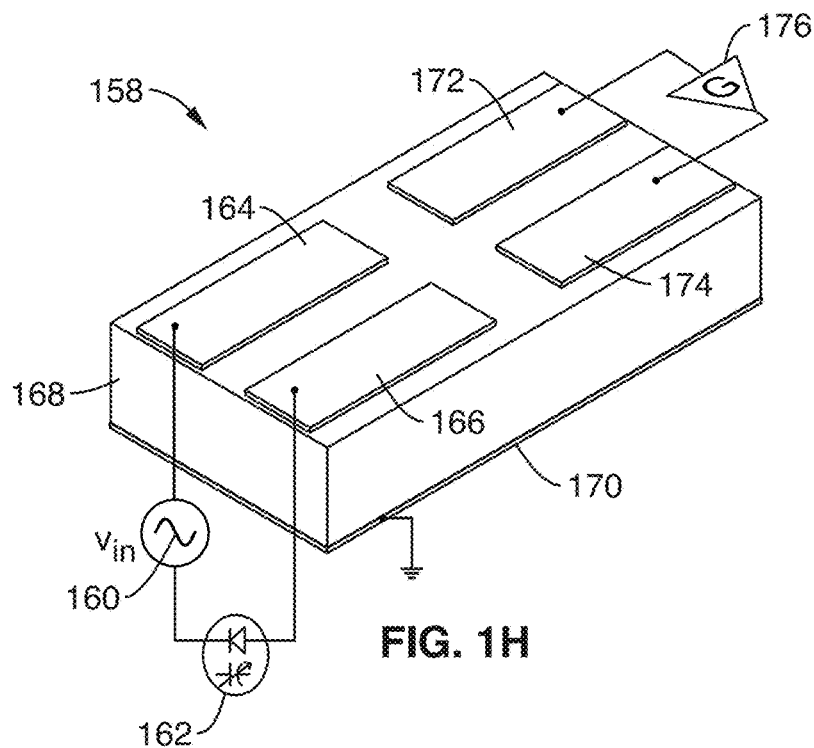
FIG. 1H is an alternative embodiment of the device of FIG. 1A using piezo-electric coupling to the resonator with frequency tuning achieved via a variable capacitance in series with an input signal.

FIG. 1H is a perspective view 158 of an alternative embodiment of the device of FIG. 1A using piezo-electric coupling to the resonator. Here, the input signal 160 is applied in series with a variable capacitance (varactor) 162 to two electrodes 164 and 166 on the top of a piezo-electric resonator 168, with the bottom electrode 170 grounded. A separate set of electrodes 172 and 174 allow additional coupling to the amplifier 176.

Figure 1I:
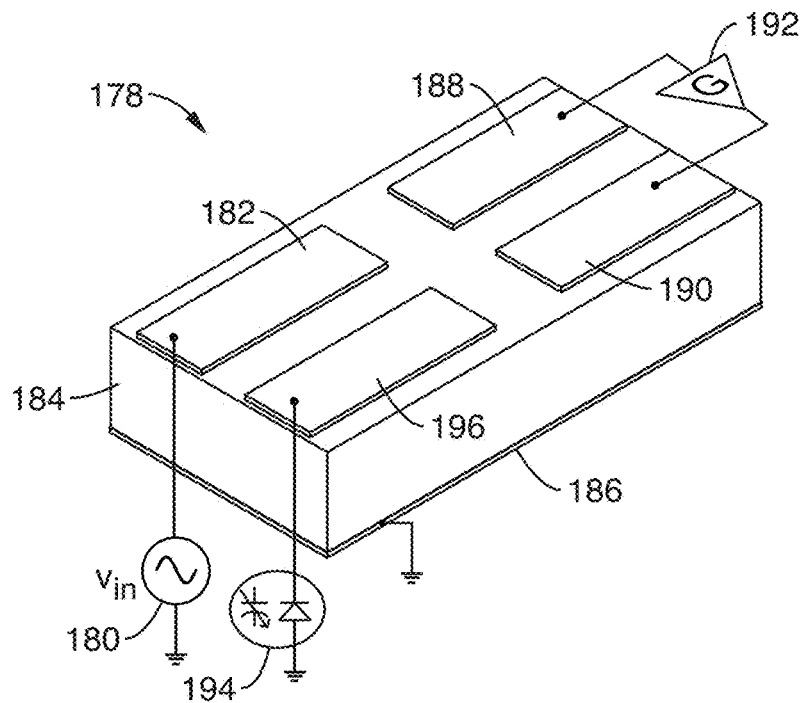
FIG. 1I is an alternative embodiment of the device of FIG. 1A using piezo-electric coupling to the resonator with frequency tuning achieved via a variable capacitance connected to one port of the resonator.

FIG. 1I is a perspective view 178 of an alternative embodiment of the device of FIG. 1A using piezo-electric coupling to one port of the resonator. Here, the input signal 180 is applied to an input electrode 182 on the top of a piezo-electric resonator 184, with the bottom electrode 186 grounded. A separate set of electrodes 188 and 190 allow additional coupling to the amplifier 192. Here, unlike the series implementation of FIG. 1H, a variable capacitance (varactor) 194 is applied to a second input electrode 196 on the top of the piezo-electric resonator 184.

The Regenerative Transceiver

Figure 2A:
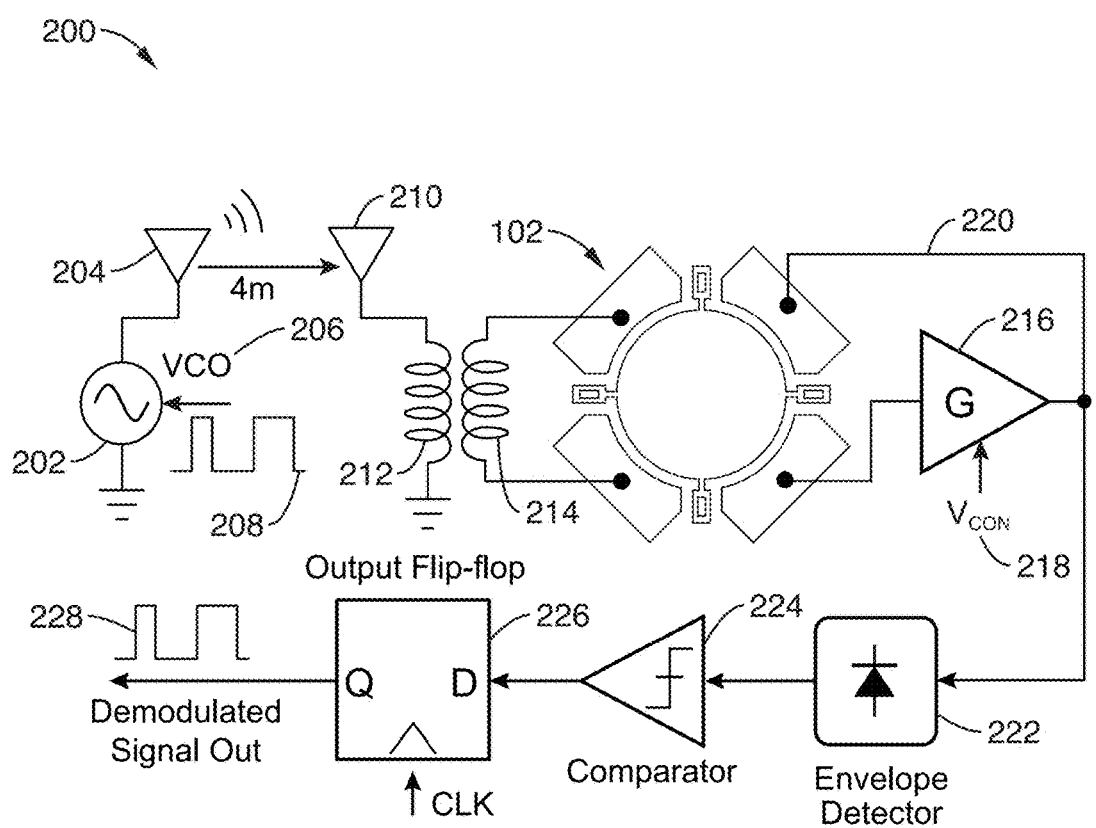
FIG. 2A is a schematic of one embodiment of a regenerative microelectromechanical system (MEMS) radio transceiver configured in receive-mode, where the MEMS resonator is used as a component of a channel-selecting filter for radio frequency (RF) signals picked up by the antenna.

Refer now to FIG. 2A, which is a schematic of a regenerative microelectromechanical system (MEMS) radio transceiver 200 configured in receive-mode, where the MEMS resonator is used as a component of a channel-selecting filter for radio frequency (RF) signals picked up by the antenna. Here the resonator structure 102 is a component of a radio transceiver configured in receive-mode.

An external source 202 is radiated via an output antenna 204, thereby providing a received input bit-stream modulated on a carrier frequency as a signal source. The external source 202 is controlled by a voltage controlled oscillator 206 to transmit a data signal train 208 typically via frequency shift keying (FSK) or on-off keying (OOK).

An input antenna 210 receives the output antenna 204 signals, in this example, and without limitation, within a range of about 4 m. The input antenna 210 is passed to a transformer primary 212, and thereby coupled to the transformer secondary 214. The resonator structure 102 applies the needed channel-selecting filter to the radio frequency (RF) signals picked up by the input antenna 210.

An application-specific integrated circuit (ASIC) 216 amplifier regeneratively amplifies the weak received in-band signal from the resonator structure 102 to produce a growing oscillation output, periodically quenched via an externally supplied control voltage $V_{con}$ 218. The output 220 of the ASIC 216 is regeneratively routed back to the resonator structure 102 to provide the regenerative detection function.

Additionally, the ASIC 216 output 220 is electrically connected to an envelope detector 222, then to a comparator 224, and finally to a flip-flop 226 that recovers a recovered signal 228 that should mirror the original transmitted digital data signal train 208.

Figure 2B:
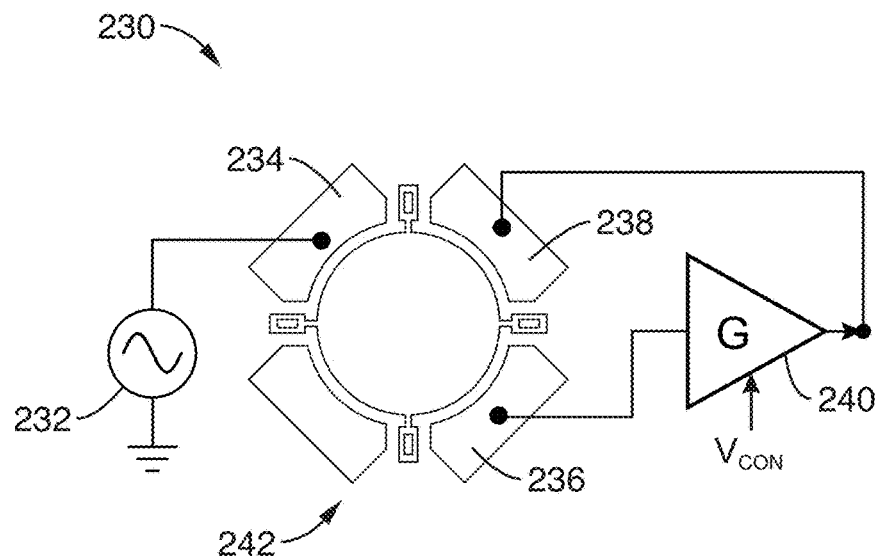
FIG. 2B is a schematic of one embodiment of the regenerative transceiver in receive mode, where a single-ended input signal (e.g. from an antenna) is applied to one electrode.

Refer now to FIG. 2B, which is a schematic 230 of one embodiment of the regenerative transceiver in receive mode, where the input signal 232 (e.g. from an antenna) is applied to a single electrode 234. As previously described, an amplifier 236 is disposed between electrodes 238 and 240 of the resonator 242.

Figure 2C:
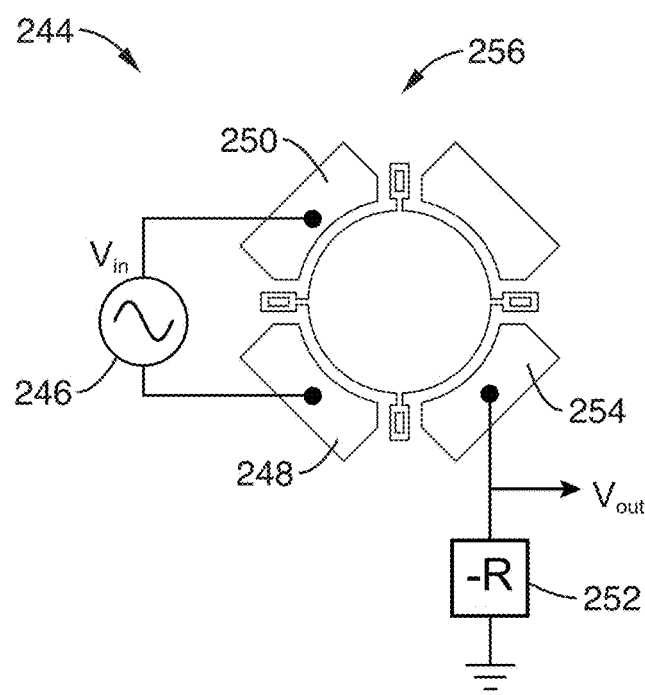
FIG. 2C is a schematic of one embodiment of the regenerative transceiver in receive mode, where the regenerative gain is derived from a negative-resistance amplifier connected to a single electrode of the resonator.

Refer now to FIG. 2C, which is a schematic 244 of one embodiment of the regenerative transceiver in receive mode with a differential input 246 to electrodes 248 and 250, where the regenerative gain is derived from a negative-resistance amplifier 252 connected to a single electrode 254 of the resonator 256.

FIG. 2A represents the system-level design used for one embodiment of the super-regenerative receiver in this application.

Figure 3A:
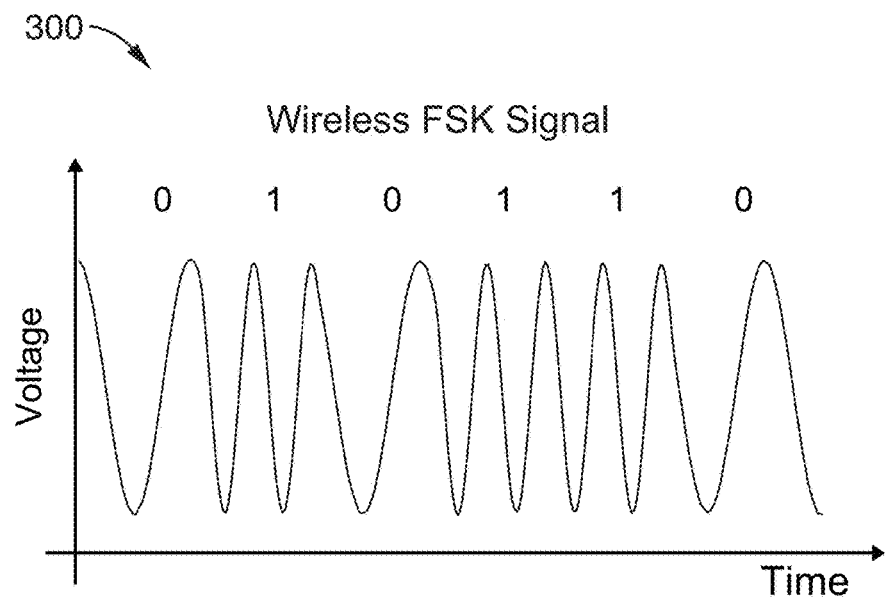
FIG. 3A is a graph of voltage versus time of a wireless frequency shift keying (FSK) waveform transmitting a binary data stream.

Refer to FIG. 2A through FIG. 2C for background, and now to FIG. 3A through FIG. 3D, which illustrate the various waveforms found in the conceptual operation of the regenerative receiver. In FIG. 3A, a binary frequency shift keying (BFSK) signal 300 is modulated and transmitted. When received, the BFSK signal 300 gives rise to regenerative signal periodically restarted oscillation (302 of FIG. 3B) as the ASIC 216 output 220. Because the rise time is determined by the level of signal at resonance frequency, an OOK modulated signal would equally allow detection with the same oscillation waveforms.

When the resonator structure 102 has applied an input signal at resonance, the resonator structure 102 generates faster oscillation growth than an input signal significantly off of resonator structure 102 resonance. Here, ASIC 216 output 220 output drops to zero when $V_{con}$ is raised, though resonator motion decays with a time constant based on the resonator disk 102 quality factor (Q). Oscillation quenching could likewise be obtained by a separate switch cutting the signal input or output from the amplifier, or even by removing the bias voltage from the capacitive-gap resonator here.

Figure 3B:
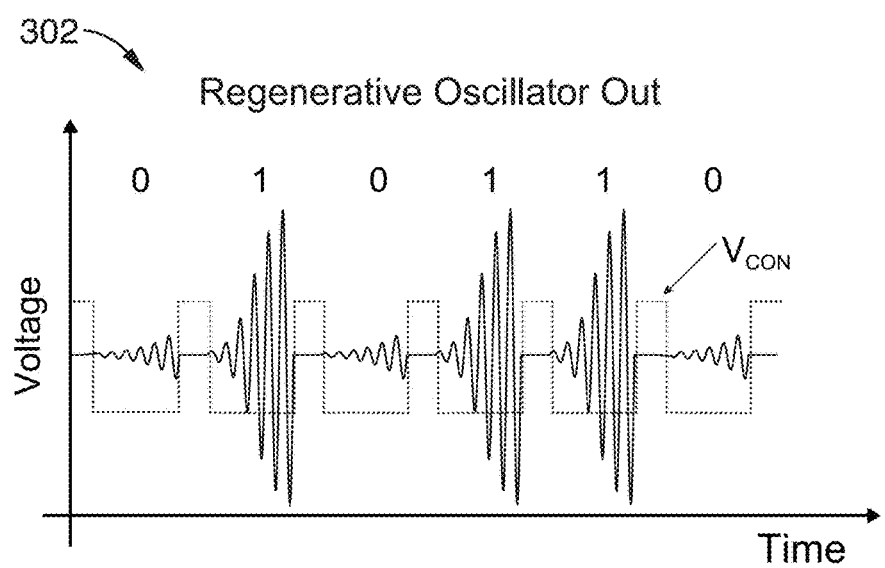
FIG. 3B is a graph of voltage versus time of the ASIC amplified resonator disk output voltage of FIG. 2, showing periodically restarted oscillation of the resonator disk from the input signal of FIG. 3A.
Figure 3C:
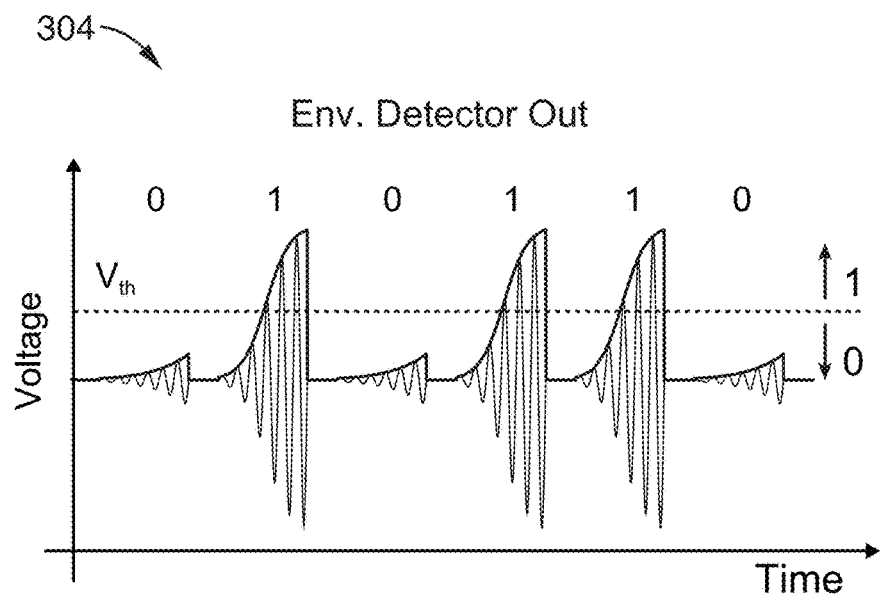
FIG. 3C is a graph of voltage versus time of the envelope of the waveform of FIG. 3B, where the on-resonance input signals generate faster resonator disk oscillation growth.

In FIG. 3C, the ASIC 216 output 220 envelope amplitude exceeds a threshold voltage ($V_{th}$) 304, which are detected in an envelope detector 222.

Figure 3D:
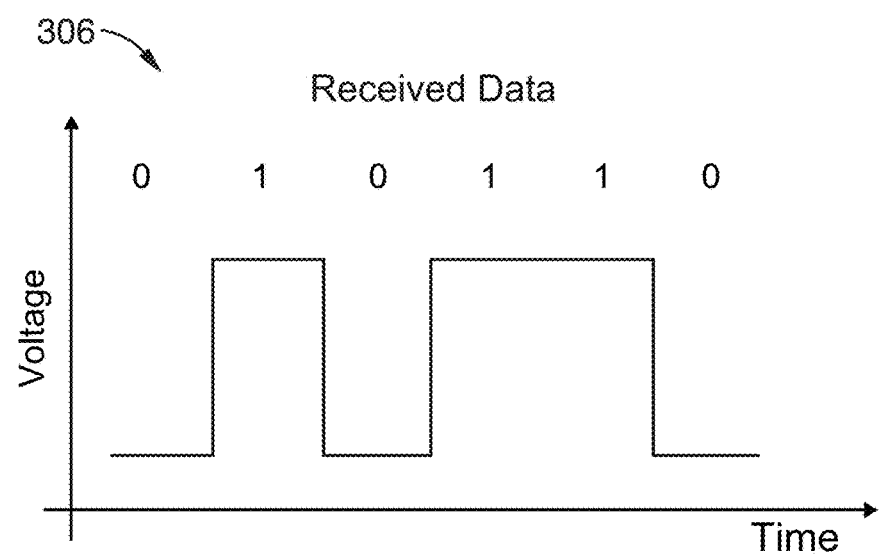
FIG. 3D is a graph of the recovered signal from the original transmitted digital data signal train.

In FIG. 3D, the output of the envelope detector 222 allows for the discrimination of '0's and '1's through the flip-flop 226, thereby recovering a recovered digital data signal train 306 that mimics the original transmitted digital data signal train 208.

This super-regenerative receiver system identifies an incoming '1' or '0' by measuring the rate that oscillation grows in a positive feedback circuit. An absence of received input antenna 210 signal power in the resonance passband results in a slow rise in oscillation amplitude of the resonator disk 102, which indicates a '0'. On the other hand, when the received input antenna 210 signal power is at or near resonance, the signal couples into a positive feedback loop, speeding up the rise time to indicate a '1'.

Operated in such a fashion, this regenerative MEMS radio transceiver forms a BFSK demodulator, where the FSK 'mark' and 'space' correspond to on and off-resonance signals, respectively, which may be used to signify the presence of a binary '1' or '0' respectively. Similarly, if OOK demodulation is instead desired, the 'on' and 'off' signals would correspond to a '1' or '0'.

To generate a stream of recovered 228 receive bits, a periodic quench signal $V_{CON}$ 218 restarts oscillation, allowing each bit to be decoded in a separate, short oscillation growth as seen in FIG. 3B. The output of this oscillator forms the base of the regenerative receiver.

FIG. 3C shows one such method where the envelope of the periodic oscillation growth produced by the envelope detector 222 of FIG. 2. The output of this envelope detector feeds a comparator 224, the output of which in turn is latched into a flip-flop 226 to recover the original transmitted data signal train 208, which is shown in FIG. 3D.

With the high Q possible with MEMS resonators, this receiver isolates a single narrow channel while rejecting signals in nearby channels, spaced in one embodiment at 4 kHz apart. Because the amplifier in such a design is isolated from the input antenna with only on-resonance signals passed through the MEMS resonator, out-of-channel interferers are blocked. This is a significant improvement over previous regenerative receiver architectures, where loop amplifiers must handle any spurious signal received by the antenna without causing excessive intermodulation. Here, the filtering of any such interferers greatly relaxes the linearity, and hence power consumption, of the amplifier.

Meanwhile, with voltage tunable frequency, such MEMS resonant structure 102 oscillators may also be configured as frequency-modulated elements, offering a uniquely simple, continuous-phase Frequency-Shift Keying transmitter. Such operation can be enabled using the same circuit as used for receive-mode described above in FIG. 2, but with amplifier gain held constant to generate a continuous RF carrier.

Figure 4A:
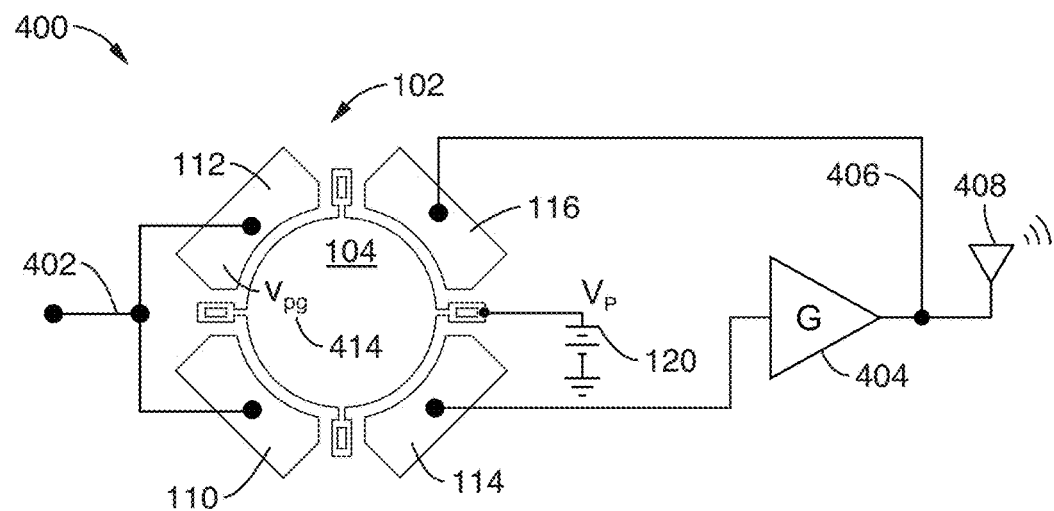
FIG. 4A is a schematic of one embodiment of a MEMS radio transceiver configured in transmit-mode, where the demodulating circuitry previously discussed in FIG. 2 has been switched out for an FSK modulating input applied to the resonator disk input electrodes.

Refer now to FIG. 4A, which is a schematic 400 of the MEMS radio transceiver configured in transmit-mode where the demodulating circuitry previously discussed in FIG. 2 has been switched out for an FSK modulating input bit-stream 402 applied to the resonator structure 102 input electrodes 110 and 112. Feedback input electrode 114 connects with transimpedance amplifier 404, whose output 406 is fed back to the resonator structure 102 disk feedback output electrode 116, and also to antenna 408. In this configuration, the transimpedance amplifier 404 gain is no longer quenched, hence the control voltage $V_{CON}$ 132 previously shown in FIG. 1A has been omitted.

Figure 4B:
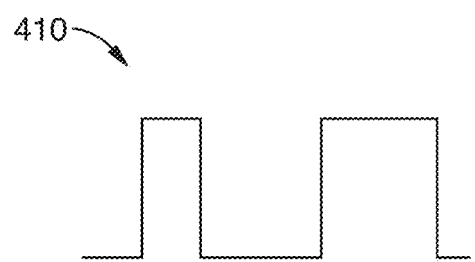
FIG. 4B is a graph of voltage versus time of an input data bit-stream used for transmission of an FSK through the transmitter of FIG. 4A.
Figure 4C:
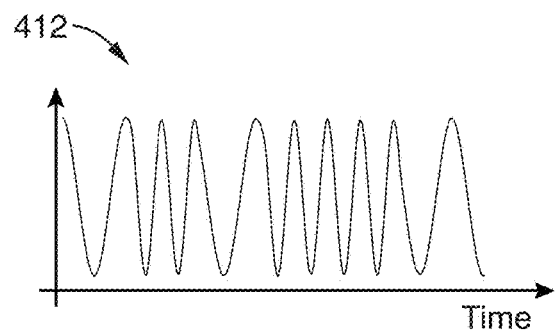
FIG. 4C is a graph of the FSK voltage versus time of the output FSK signal transmitted through the antenna of the transmitter of FIG. 4A.

Refer now to FIG. 4A through FIG. 4C, of which FIG. 4B and FIG. 4C show the waveforms associated with the device of FIG. 4A. With the unquenched transimpedance amplifier 404 gain, an original input data bit-stream 410 creates a continuously modulated radio frequency (RF) carrier 412 (in FIG. 4C) is generated that is the FSK representation of the input data bit-stream 410.

An important determining factor for the resonator disk 104 is the voltage across the electrode-to-resonator gap. This may be defined as $V_{pg}$ 414. $V_p$ 120 is a constant bias voltage applied to the resonator disk 104 with respect to ground, and is used to provide coupling and broad tuning of the resonator disk 104. If the input bit-stream 410 input voltage 402 is represented by $V_{in}$, then $V_{pg}=V_p-V_{in}$ is the total frequency-setting voltage operating on the resonator disk 104. Note that because this is acting on only two of the four electrodes of the device (in this example), the effect is half that of a $V_p$ 120 change, but this is still easily sufficient to effect the desired FKS modulation of the resonator disk 104.

Figure 4D:
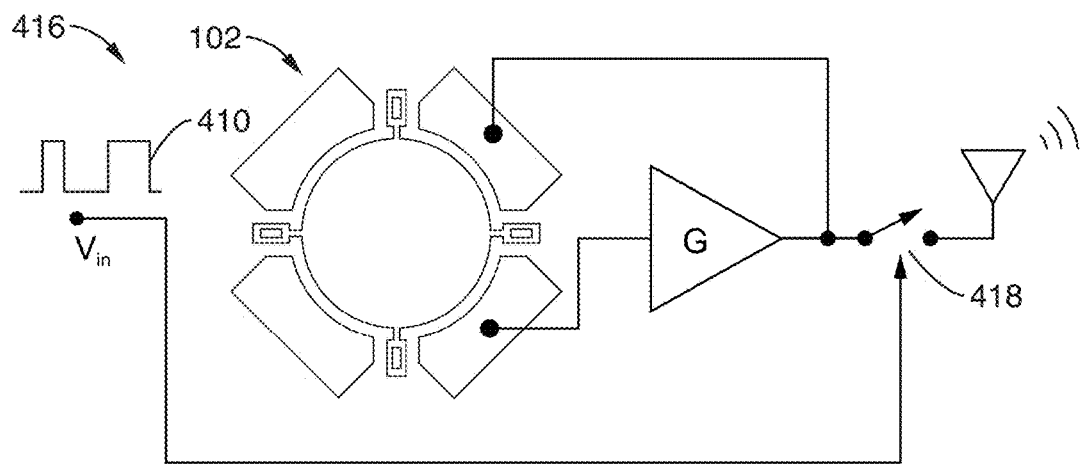
FIG. 4D is a schematic of a MEMS transceiver similar to that of FIG. 4A that is instead configured for On-Off Keying (OOK) transmission.

Refer now to FIG. 4D, which is a schematic 416 of a MEMS transceiver (in transmitter mode) similar to that of FIG. 4A that is instead configured for On-Off Keying (OOK) transmission. Here, instead of using the frequency tuning effect previously described, the oscillator output is simply switched 418 on and off via the input bit-stream 410.

Figure 4E:
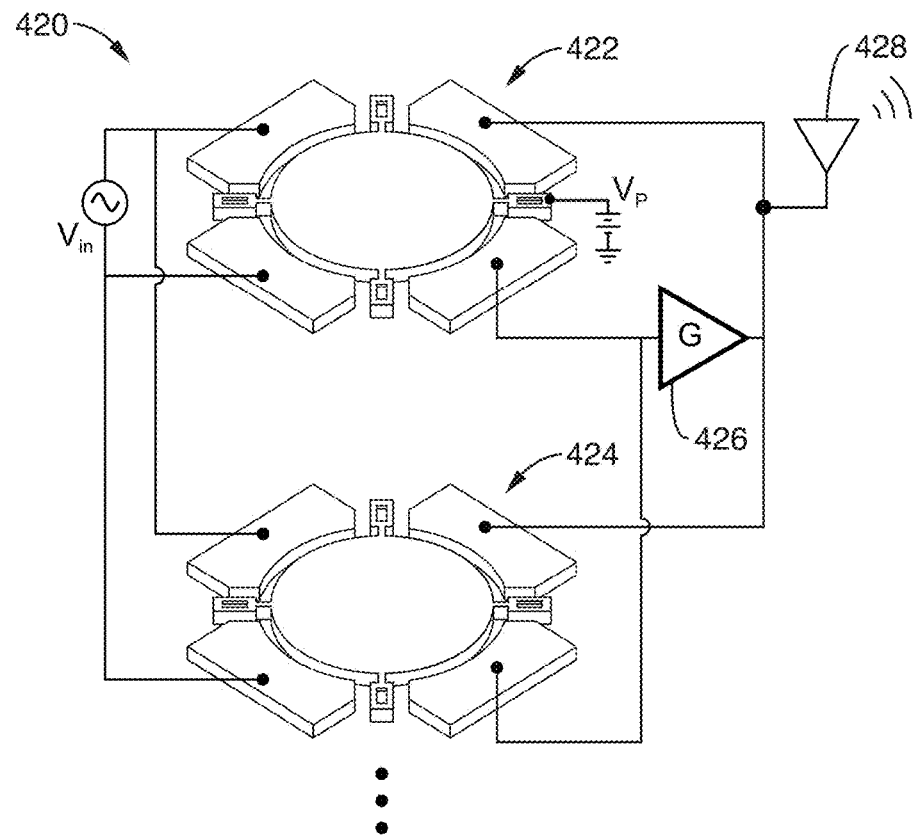
FIG. 4E is a schematic of one embodiment of the MEMS radio transceiver making use of two or more resonators at separate frequencies while operating using a single amplifier in order to broaden the operating frequency range and achieve multiple simultaneous receivers and/or transmitters.

Refer now to FIG. 4E, which is a schematic 420 that illustrates an expansion of the single-resonator implementation of FIG. 4A with two or more parallel resonators 422 and 424 operated via a single amplifier 426. Here, each resonator 422 and 424 may be designed with differing operating frequency to allow for multiple simultaneous transmitters through antenna 428 as in FIG. 4A and FIG. 4B, and to allow a greater selection of frequencies to be used for reception as in FIG. 1A or FIG. 1E.

Sustaining Amplifier Design

Figure 5A:
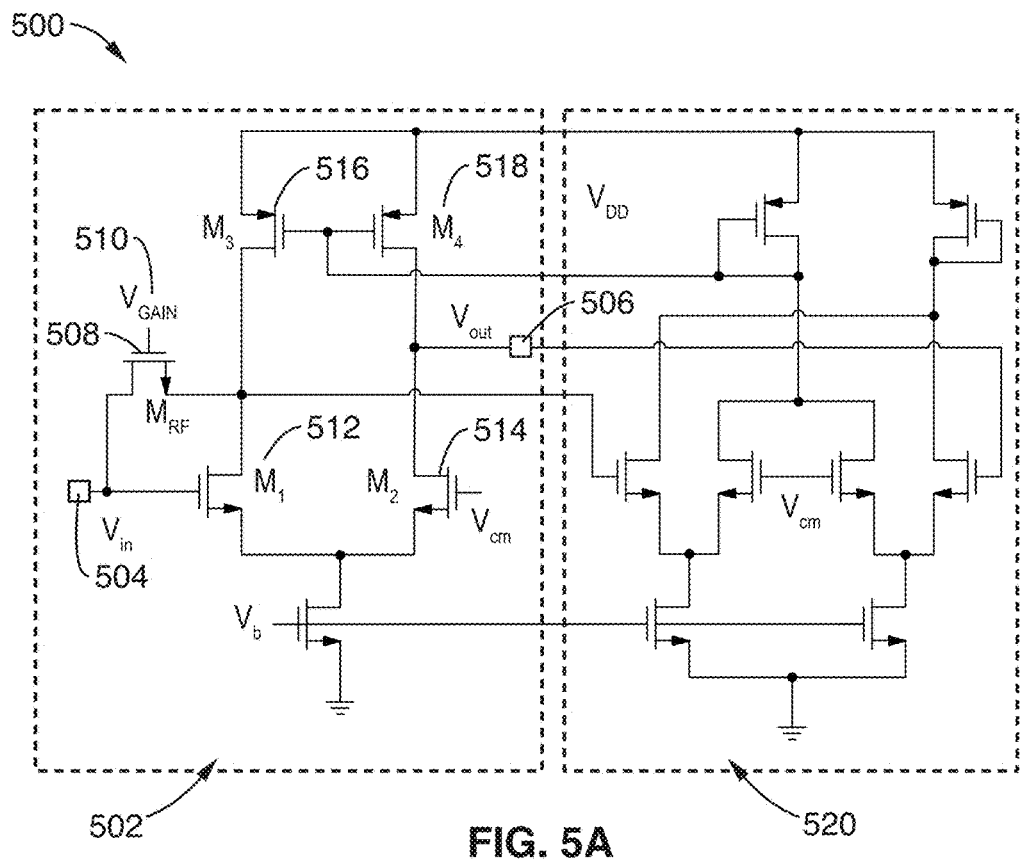
FIG. 5A is a schematic of one embodiment of a transimpedance amplifier that may be used in this system.

Refer now to FIG. 5A, which is a detailed circuit of one possible amplifier design, a transimpedance amplifier 500 circuit comprising a fully differential CMOS transimpedance amplifier 502 with one end connected in shunt-shunt feedback to $V_{IN}$ 504, and output 506 taken from the other end to realize a 0° input-output phase shift. Transistor $M_{RF}$ 508 serves as the voltage controllable shunt-shunt feed-back resistor, allowing easy adjustment of transimpedance amplifier 502 gain via its gate voltage $V_{GAIN}$ 510.

Transistors M1-M4 (respectively 512, 514, 516, and 518) form the basic differential transistor pair biased by a common-mode feedback (CMFB) circuit 520 that preserves low output resistance and cancels out common-mode noise, including noise caused by vibration. The action of the CMFB circuit 520 symmetrically balances the differential pair circuit. This yields a transconductance gain ($G_m$) of 0.5 $g_{m1}$ and output resistance ($R_{aout}$) of approximately $r_{o2}//r_{o4}$, where $g_m$ and $r_o$ are transconductance and output resistance of a transistor respectively. The MOS transistor $M_{RF}$ 508 is biased in the triode region to serve as a voltage controllable shunt-shunt feedback resistor ($R_F$) that allows convenient adjustment of the TIA gain via its gate voltage, $V_{GAIN}$ 510.

Figure 5B:
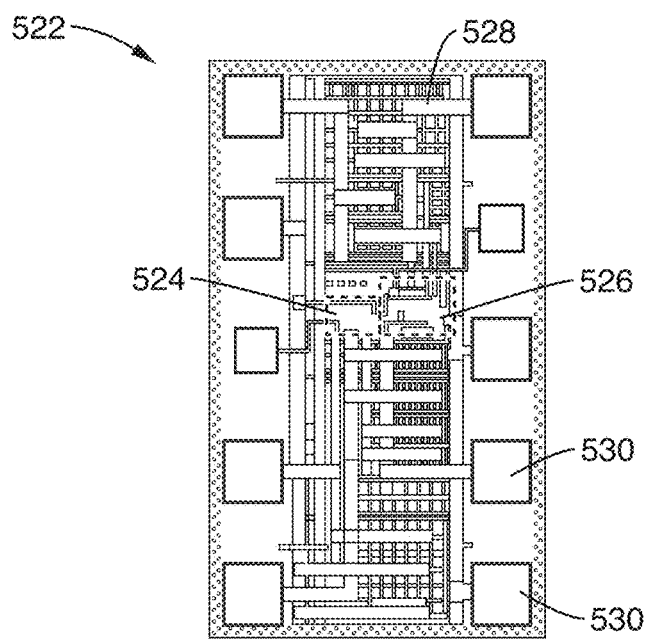
FIG. 5B is a photomicrograph of the fabricated amplifier application specific integrated circuit (ASIC) of FIG. 5A that has been wire bonded to external hardware.

Refer now to FIG. 5B, which is a photomicrograph of the fabricated amplifier application specific integrated circuit 522. Here, the amplifier integrated circuit 524 was fabricated in a 0.35 μm CMOS technology. Although the entire die, shown in FIG. 5B, occupies an area of 900 μm×500 μm, the actual sustaining amplifier 524 only consumes about 60 μm×60 μm. The rest of the area is consumed by 1) an on-chip buffer 526 used to drive 50Ω measurement systems; 2) by-pass capacitors 528 further reduce noise on DC supply lines; and 3) bond pads 530.

Though the embodiment demonstrated herein uses a transimpedance amplifier, it should be appreciated that many other amplifier topologies may be substituted. Indeed, any two-port amplifier can create the gain between input and output needed to achieve the Q-boosting described. Furthermore, an approach such as a negative-resistance amplifier could likewise provide the gain needed to achieve the Q control when connected to a single resonator port.

With trans-resistance gain $R_{amp}$ sufficient to overcome resonator losses, the oscillator loop amplitude rises exponentially with time constant given by:

$$\tau = \frac{2L_x}{R_{Amp} + R_x} \quad (1)$$

where $R_x$ and $L_x$ are the equivalent circuit model elements for the MEMS resonator tank previously shown in FIG. 1B. An on-resonance signal reduces the time required to rise to the '1'-bit threshold amplitude in two ways: first, the drive is resonantly enhanced to produce a resonator starting amplitude much larger than the background thermal noise; and second, the input signal continues to drive the resonator to increased amplitude during oscillation startup. For other amplifier designs, the same basic rise behavior holds, only with time constant given by relative amplifier gain and resonator loss, rather than explicitly $R_{amp}$ and $R_x$.

As with any filter, the bandwidth of the filter limits the possible data transmission rate. Here, such a limit is enacted by the decay time required for the resonator disk to reach a low amplitude of motion following the relatively higher amplitude resonance of a '1' bit. If the amplifier quench time falls short of the decay time of the resonator (here a long 0.5 ms due the high Q), oscillation will restart quickly even in the absence of an input signal, preventing detection of subsequent '0' bits.

MEMS Resonator

To meet the filtering requirements of channel-select radio applications, it is desired here that the MEMS resonators used possess both a useful RF operating frequency and sufficient Q to achieve the narrow bandwidths desired for the sensor node application. To this end, the resonator structures depicted in FIG. 1A and FIG. 2 are quite suitable, with the added capability to accurately define multiple unique frequencies on the same die via only minor modifications of the device layout, thus expanding possible operating frequency beyond that achievable from electrical stiffness tuning alone.

In the embodiment of FIG. 1A and FIG. 2, the base resonator disk device comprises a 2 μm-thick polysilicon disk supported by beams at quasi-nodal points and coupled along its sidewalls to input-output electrodes by tiny 65 nm capacitive gaps. To drive the resonator into motion, a bias voltage $V_P$ on the disk structure combines with a differential ac drive voltage applied to input electrodes to produce forces across the input electrode-to-resonator gaps that, at resonance, excite the compound (2, 1) mode shape, previously shown in FIG. 1B. The frequency of resonance is given by:

$$f_{nom} = \frac{K}{R}\sqrt{\frac{E}{\rho(2+2\sigma)}} \quad (2)$$

where R is the disk radius, K a material-dependent constant equal to 0.373 for polysilicon, and E, σ, and ρ are the Young's modulus, Poisson ratio, and density of the polysilicon material, respectively.

In such resonators, a position-dependent electrical force across the capacitive gap additionally gives rise to the required electrical stiffness effect and resultant resonance frequency shift, given by:

$$k_e = -\alpha \frac{\varepsilon_0 A V_P^2}{d^3} \text{ and } f_0 = f_{nom}\left[1 + \frac{k_e}{k_m}\right]^{1/2} \quad (3)$$

where $\varepsilon_o$ is the vacuum permittivity, A is the resonator-electrode overlap area, $V_P$ is the voltage placed across the gap, d is gap width, and α is a dimensionless constant based on mode and electrode shape, equal to 0.637 for the design used here.

Experimental Realization

Figure 6A:
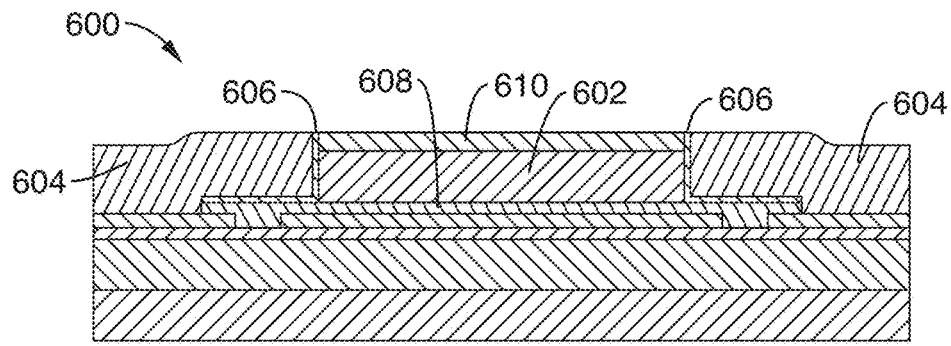
FIG. 6A is a cross section illustrating one embodiment of a MEMS resonator prior to resonator disk release in 49% HF.
Figure 6B:
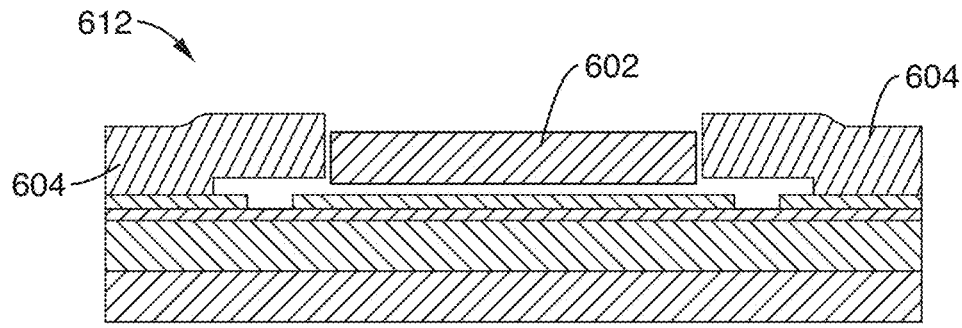
FIG. 6B is a cross section of the MEMS resonator of FIG. 8A after resonator disk release in 49% HF.
Figure 6C:
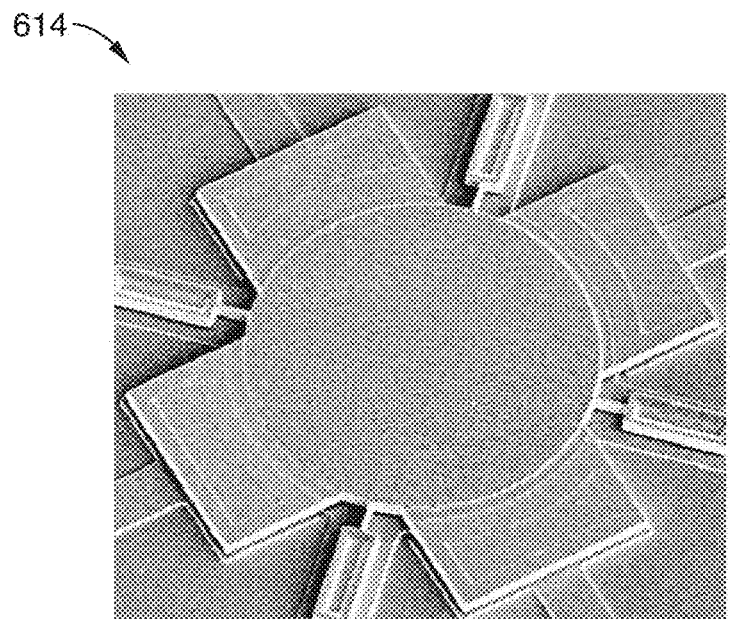
FIG. 6C is a scanning electron micrograph (SEM) of the device of FIG. 6B, which was used in this disclosure.

Refer now to FIG. 6A through FIG. 6C. To experimentally verify the utility of active Q-boosting, wine-glass resonators were designed and fabricated with a process summarized in the cross sections of FIG. 6A and FIG. 6B.

FIG. 6A is a cross section 600 illustrating one embodiment of a MEMS resonator prior to resonator disk release in 49% HF. Here, doped polysilicon serves as the structural material for resonator 602 and electrodes 604, alike, and the gaps 606 between the resonator 602 and electrodes 604 were set at 65 nm by a sacrificial high-temperature oxide spacer 608 that is removed in the final release step. The process differs from previous ones in that it removes electrode overhangs via chemical mechanical planarization (CMP)—a step that improves the reliability of devices under larger DC-bias voltages. An additional sacrificial hard mask 610 protects the top surface of the resonator 602 during some of the etching procedures.

FIG. 6B shows the cross section 612 of FIG. 6A, where the sacrificial high-temperature oxide spacer 608 (of FIG. 6A) and the additional sacrificial hard mask 610 (also of FIG. 6A) have both been removed in 49% HF to yield the final device imaged in the SEM of FIG. 6C.

FIG. 6C presents a scanning electromicrograph SEM of a fabricated device 614 of FIG. 6B following release in 49% HF. The device here has a radius of 32 μm, electrode-to-resonator gap spacing of 65 nm, and DC-bias voltage $V_P$ of 10 V. This fabricated device provides a coupling strength of $(C_x/C_o)$ ~0.04% at an operating frequency of 61 MHz, sufficient for the 0.001% bandwidth filter demonstrated here.

To construct a complete radio transceiver, released MEMS resonators are wire bonded together with the CMOS ASIC described above and affixed to PCB circuits that provided all needed bias voltages as well as the simple off-chip RF diode detector and flip-flop circuit used for data recovery.

Refer now to FIG. 7A, which is a photograph of the assembled MEMS transceiver 700 mounted in a custom bell-jar setup to allow measurement in a μ Torr vacuum. The hermetic feed throughs seen on the right connect the radio to a simple antenna formed from ~20 cm of wire. A bench-top frequency-synthesizer connected to a $2^{nd}$ antenna positioned 4 m from the receive antenna provided wirelessly transmitted test signals.

Refer now to FIG. 7B, which is an enlargement 702 of a portion of the photograph of FIG. 7A, where the MEMS and ASIC dies is shown, with both devices fabricated with many devices on a single die (e.g. one or more), one each wire bonded to the PCB.

Measurements

Refer now to FIG. 8A through FIG. 8E. These figures show the measured time traces showing the operation of one embodiment of the receiver circuit of FIG. 2. In this set of figures, MEMS resonator structure 102 of FIG. 2 is biased with 10.3 V, and the ASIC is operated on a 2.1 V power supply drawing ~233 μA.

FIG. 8A is a graph 800 of receiver operation for a 1 kbps input bit-stream transmitted across a distance of 4 m using the device previously described in FIG. 2 using a Binary FSK modulated transmitter with 1 kHz shift on a 60.6 MHz RF carrier, and output power of −17 dBm (20 μW) at a data rate of 1 kilo baud per second (kbps).

FIG. 8B is a graph 802 of the representative FSK modulated transmitter signal section of FIG. 8A. To make the signal more readily viewable, the signal has been down-mixed from 60.6 MHz to 2 kHz by using a bench-top signal generator.

Figure 8C:
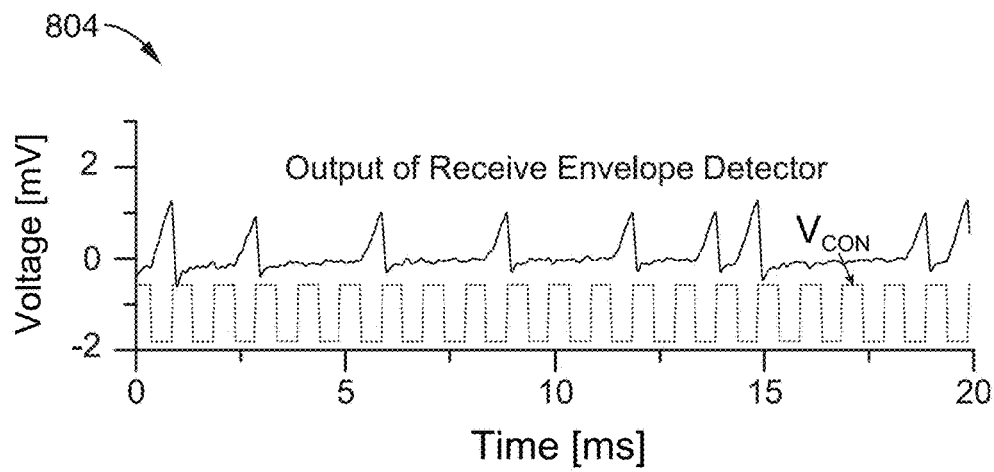
FIG. 8C is a graph of the output of the regenerative receiver amplitude following envelope detection, with the control voltage $V_{con}$ periodic quenching waveform also shown.

FIG. 8C is a graph 804 of the output of the regenerative receiver amplitude following envelope detection after processing the waveform of FIG. 8B, with the control voltage $V_{con}$ periodic quenching waveform also shown. The periodic control voltage $V_{con}$ gates the regenerative amplifier gain control at the receive data rate to periodically grow and quench oscillation of the resonator disk.

An input receiver antenna is located at a distance of 4 m from the transmitter output antenna (for this non-limiting example) to provide an input data signal. Here, small in-band signals are regeneratively amplified to create the observed speed-up in oscillation amplitude growth, clearly distinguishing mark vs. space frequency of the transmitted signal.

Figure 8D:
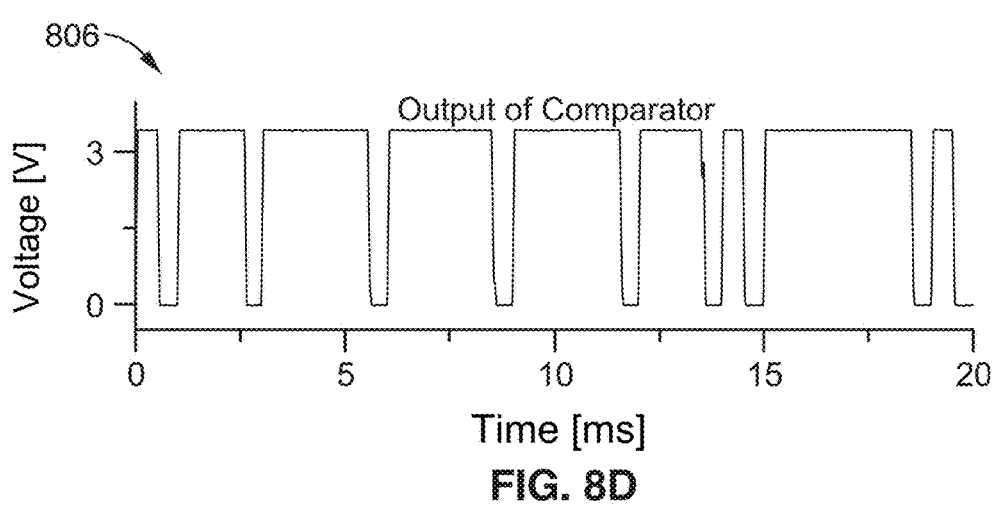
FIG. 8D is a graph that shows the resultant signal following the comparator of the envelope detection output of FIG. 8C.

FIG. 8D is a graph 806 that shows the resultant signal following the comparator of the envelope detection output of FIG. 8C.

Figure 8E:
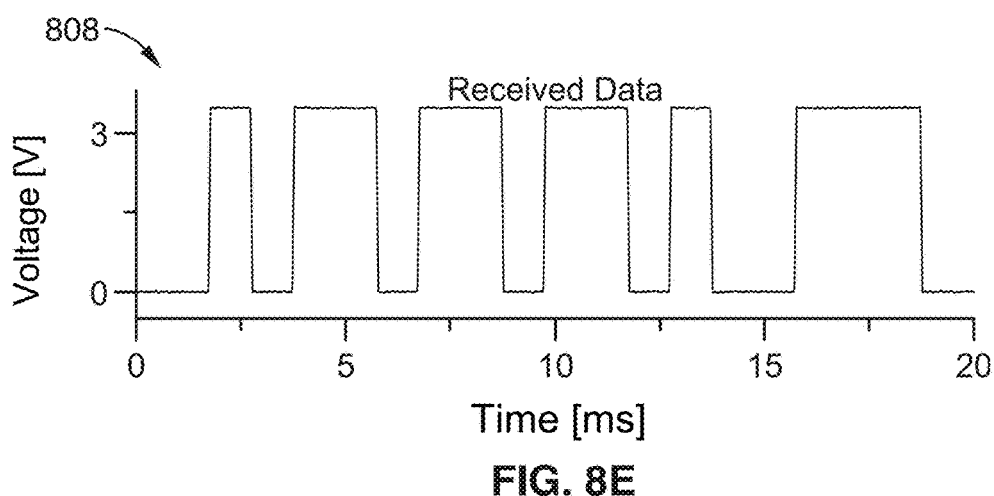
FIG. 8E is a graph that represents the final recovered data-stream from the waveform of FIG. 8D clocked by an output flip-flop, with the MEMS resonator biased with 10.3 V, and the ASIC operated on a 2.1 V supply drawing ~233 µA of current.

Finally, FIG. 8E is a graph 808 that represents the final recovered data-stream of FIG. 8D clocked by the output flip-flop (226 of FIG. 2). The input bit-stream of FIG. 8A has therefore successfully been transmitted and reconstructed in the recovered data-stream.

In this non-limiting laboratory test, despite the use of make-shift input and output antennas, the performance is remarkable and demonstrates the sensitivity and selectivity of the capacitive-gap MEMS-based receiver, even in the face of typical interference sources in an unshielded laboratory environment. This gives rise to the question of how susceptible the system is to outside interference.

Figure 9:
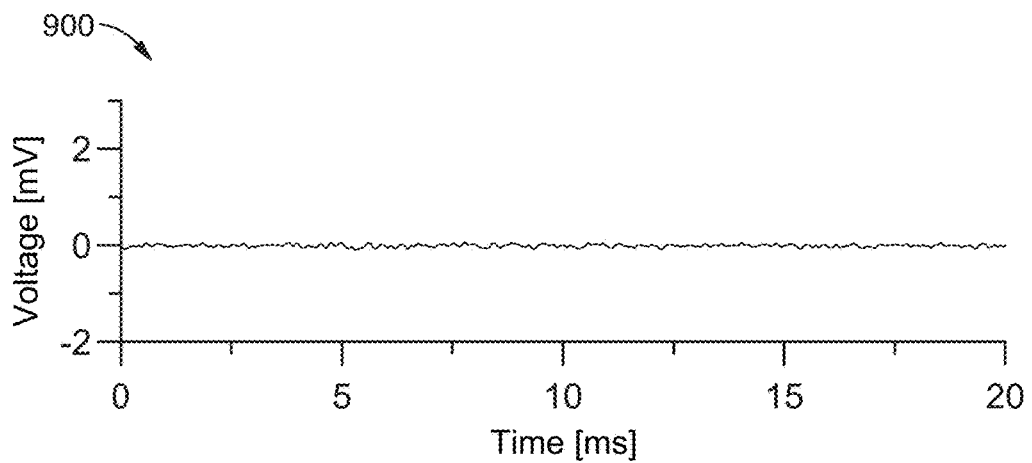
FIG. 9 is a graph of measured regenerative receiver signal when the transmitter signal is shifted by 4 kHz to a nearby channel and increased by 30 dB in power indicating a complete lack of interference.

Refer now to FIG. 9, which is a graph 900 of measured regenerative receiver signal when the transmitter signal is shifted by 4 kHz to a nearby channel and increased 30 dB in power. Here, it is apparent that the system, even at a laboratory prototype stage, shows no detected signal, as it should.

Figure 10A:
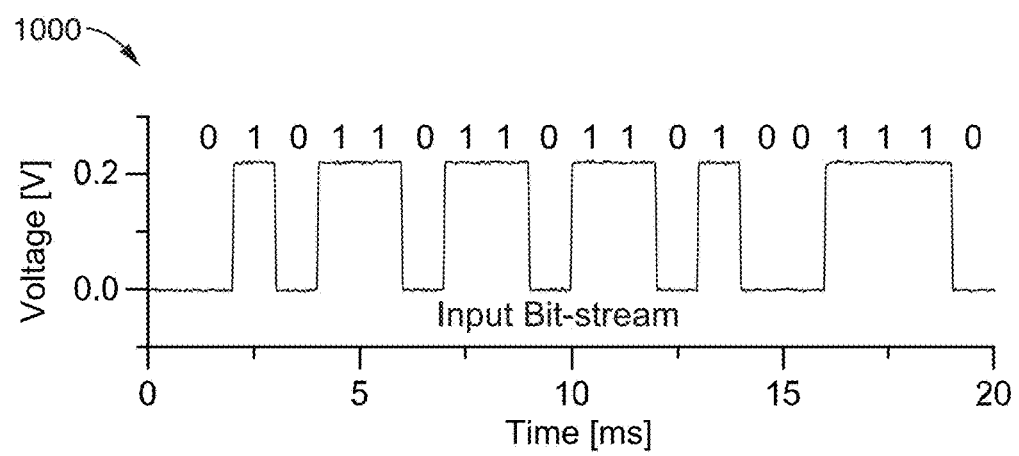
FIG. 10A is a graph of voltage versus time of a representative 1 kbps input bit-stream.
Figure 10B:
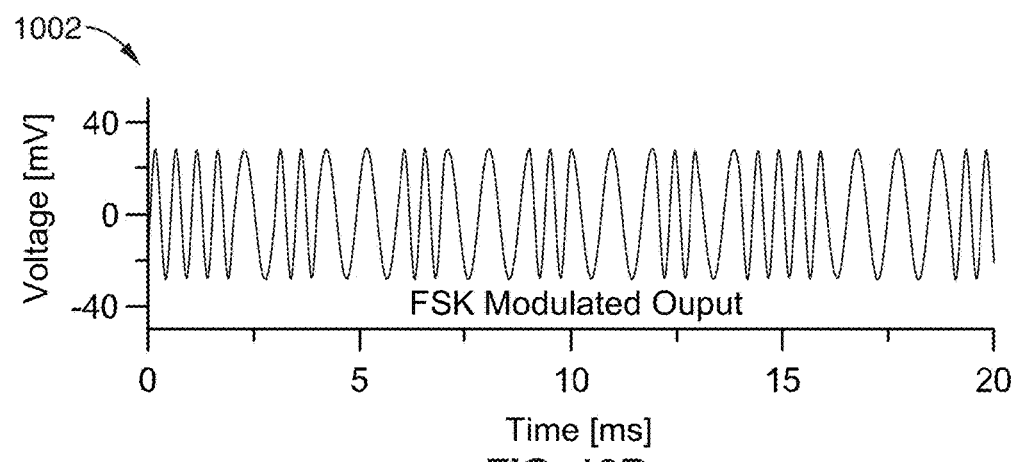
FIG. 10B is a graph of voltage versus time of the transmitted 1 kbps input bit-stream of FIG. 10A transmitted using the Binary FSK modulated transmitter with a 1 kHz shift on a 60.6 MHz RF carrier, and output power of −17 dBm (20 µW), using the circuit of FIG. 4, with the representative FSK modulated transmitter signal down-mixed to 2 kHz for viewing by using a bench-top signal generator.

Refer now to FIG. 10A and FIG. 10B, which describe regenerative transmission (or transmit mode) using a resonant structure in an output configuration. Also refer to FIG. 4A for the regenerative transceiver in transmit mode.

FIG. 10A is a graph 1000 of a representative 1 kbps input bit-stream.

FIG. 10B is a graph 1002 of the transmitted 1 kbps input bit-stream of FIG. 10A transmitted using the Binary FSK modulated transmitter with a 1 kHz shift on a 60.6 MHz RF carrier, and output power of −17 dBm (20 μW), using the circuit of FIG. 4A. Here, for viewing, the representative Binary FSK modulated transmitter signal has been down-mixed to 2 kHz by using a bench-top signal generator.

In transmit mode, the transimpedance amplifier (TIA) gain is no longer gated with control voltage $V_{con}$, and the transmit data-stream is applied to the input electrodes. Since control voltage $V_{con}$ is not gated, the transimpedance amplifier G 404 is shown without any control voltage $V_{con}$ signal. With the input data encoded in the 200 mV swing seen in FIG. 10A, the oscillation output of FIG. 10B is seen to undergo a fast-response, continuous-phase FSK modulation, well-suited to the desired transmit function.

CONCLUSIONS

Using a periodically quenched transimpedance amplifier ASIC, the demonstrated MEMS-based circuit provides not only reliable selection and detection of individual narrow-band channels, but also FSK or OOK generation for transmission, and marks an initial demonstration of an RF channel-select-capable MEMS radio transceiver. Additionally, separate MEMS resonator electrodes for the antenna input and the amplifier loop shield the amplifier from out of band interferers. This greatly relaxes the amplifier linearity specification, which lowers its power consumption to enable a significant improvement over previous regenerative MEMS receiver topologies.

Although frequency shift keying (FSK) and on-off keying (OOK) were primarily discussed in this disclosure, traditional chirping, either linear or non-linear or still other methods of carrier wave encoding could be readily adapted to the apparatus and methods disclosed herein.

The demonstrated transceiver now offers a compelling new option for wireless sensor node devices. The power consumption here already offers significant improvement over previous sensor node systems, while the use of capacitive-gap MEMS devices provides extremely small size. Of course, transmit power above a few μW will require an additional power amplifier. For this, the narrow band and constant envelope of the FSK signal encourage the use of efficient RF amplifier topologies, and even opens the possibility of using the MEMS device itself as an efficient Class E amplifier. If expectations for lowering power consumption to less than 100 μW (such has already been demonstrated in a similar MEMS oscillator designs) are on target, then true set-and-forget nodes may soon become possible, capable of operating for long periods on tiny on-board batteries or even just scavenged power.

From the description herein, it will be appreciated that that the present disclosure encompasses multiple embodiments which include, but are not limited to, the following:

1. A regenerative transceiver, comprising: (a) a resonator, comprising; (i) a resonant structure; (ii) one or more input electrodes coupled to the resonant structure; (iii) two or more output electrodes coupled to the resonant structure; (iv) a tuning voltage $V_p$ applied to the resonant structure; (v) wherein at least a portion of the resonant structure is biased relative to at least one of the coupled input or output electrodes by the tuning voltage $V_p$; (vi) wherein a resonant frequency f of the resonant structure is changed by varying the tuning voltage $V_p$; and (b) a positive feedback loop disposed between at least two of the coupled output electrodes.

2. The regenerative transceiver of any of the embodiments above, further comprising an amplifier with a gain G electrically disposed in the positive feedback loop.

3. The regenerative transceiver of any of the embodiments above, wherein the resonant frequency f is a fundamental resonant frequency $f_0$ of the resonant structure.

4. The regenerative transceiver of any of the embodiments above, wherein the tuning voltage $V_p$ is variable from a minimum voltage $V_{min}$ to a maximum voltage $V_{max}$ that respectively corresponds to a minimum resonant frequency $f_{min}$ to a maximum resonant frequency $f_{max}$ of the resonant structure.

5. The regenerative transceiver of any of the embodiments above, further comprising: (a) an array of two or more resonant structures arranged in parallel in the positive feedback loop; (b) wherein each resonant structure has a designed minimum resonant frequency $f_{min}$ and a maximum resonant frequency $f_{max}$ independent of any other parallel resonant structure.

6. The regenerative transceiver of any of the embodiments above, further comprising: (a) wherein the transimpedance amplifier is unquenched for transmission; (b) wherein an input bit-stream signal is coupled to at least one resonator input electrode; and (c) wherein the input bit-stream signal is modulated, by the resonator and amplifier disposed within the positive feedback loop, to produce a corresponding output frequency shift keyed (FSK) signal.

7. The regenerative transceiver of any of the embodiments above, further comprising: (a) an output antenna; (b) wherein the output antenna is directly coupled to the output frequency shift keyed (FSK) signal.

8. The regenerative transceiver of any of the embodiments above, further comprising: (a) wherein the amplifier is unquenched for transmission; (b) wherein an input bit-stream signal is coupled to a switch located at the output of the amplifier; (c) wherein the input bit-stream signal is used to modulate an output On-Off Keyed (OOK) signal.

9. The regenerative transceiver of any of the embodiments above, further comprising: (a) an output antenna; (b) wherein the output antenna is directly coupled to the output OOK signal.

10. The regenerative transceiver of any of the embodiments above, further comprising means for reconstructing from a received input bit-stream carrier signal a reconstructed transmitted input bit-stream signal.

11. The regenerative transceiver of any of the embodiments above: (a) wherein the amplifier with the gain G is periodically quenched for reception; (b) wherein a received input bit-stream carrier signal is coupled to at least one resonator input electrode; and (c) wherein the means for reconstructing comprises: (i) an output oscillation produced by the resonator and amplifier positive feedback loop that corresponds to the received input bit-stream superimposed on the carrier; (ii) an envelope detector that detects an envelope of an output of the amplifier; (iii) a comparator that detects when an output of the envelope detector exceeds a threshold voltage $V_{th}$; and (4) a flip flop that uses an output of the comparator to form a reconstructed transmitted input bit-stream signal.

12. The regenerative transceiver of any of the embodiments above, wherein the electrodes are coupled to the resonant structure by a coupling selected from a group of couplings consisting of: piezoelectric, capacitive, and piezoresistive.

13. The regenerative transceiver of any of the embodiments above, wherein the resonator is tunable to any one of many radio frequency (RF) channels.

14. The regenerative transceiver of any of the embodiments above, wherein the resonant structure is a wine-glass disk resonator.

15. The regenerative transceiver of any of the embodiments above, wherein each resonant structure is selected from a group of resonators consisting of: comb-driven resonators, piezo coupled resonators, ring resonators, contour mode ring resonators, wine-glass disk resonators, wine-glass ring resonators, Lame mode resonators, bar resonators, flexural beam resonators, membrane resonators, comb-driven flexural-mode resonators, center-supported disk resonators, surface acoustic wave (SAW) devices, bulk acoustic wave (BAW) devices, film bulk acoustic resonator (FBAR) devices, lateral overmoded bulk acoustic-wave resonator (LOBAR) devices, piezo actuated resonators, internal dielectric actuated resonators, internally-transduced resonators having a capacitive couple formed from a semiconductor junction, and combinations of the foregoing.

16. A regenerative transceiver, comprising: (a) a resonator, comprising: (i) a resonant structure; (ii) a first electrode coupled to the resonant structure; (iii) a second electrode coupled to the resonant structure; and (iv) a tuning voltage applied to the resonant structure; (v) wherein at least a portion of the resonant structure is biased relative to at least one of the coupled electrodes by the tuning voltage; (vi) wherein a resonant frequency of the resonant structure is changed by varying the tuning voltage; and (b) a positive feedback loop disposed between at least a third and a fourth coupled electrodes.

17. The regenerative transceiver of any of the embodiments above, further comprising an amplifier with a gain G electrically disposed in the positive feedback loop.

18. The regenerative transceiver of any of the embodiments above, wherein the resonant frequency is a fundamental resonant frequency of the resonant structure.

19. The regenerative transceiver of any of the embodiments above, wherein the tuning voltage is variable from a minimum voltage $V_{min}$ to a maximum voltage $V_{max}$ that respectively corresponds to a minimum resonant frequency $f_{min}$ to a maximum resonant frequency $f_{max}$ of the resonant structure.

20. The regenerative transceiver of any of the embodiments above, further comprising: (a) an array of two or more resonant structures arranged in parallel in the positive feedback loop; (b) wherein each resonant structure has a designed minimum resonant frequency $f_{min}$ and a maximum resonant frequency $f_{max}$ different from any other parallel resonant structure; and (c) an output frequency shift keyed (FSK) signal that is modulated by the resonator and amplifier disposed within the positive feedback loop; (d) wherein the output frequency shift keyed (FSK) signal corresponds to the input bit-stream signal.

21. The regenerative transceiver of any of the embodiments above: (a) wherein the amplifier is unquenched for transmission; (b) wherein an input bit-stream signal is coupled to at least the first electrode; and (c) wherein the input bit-stream signal is modulated, by the resonator and amplifier disposed within the positive feedback loop, to produce a corresponding output frequency shift keyed (FSK) signal.

22. The regenerative transceiver of any of the embodiments above, further comprising: (a) an output antenna; (b) wherein the output antenna is directly coupled to the output frequency shift keyed (FSK) signal.

23. The regenerative transceiver of any of the embodiments above: (a) wherein the amplifier is unquenched for transmission; (b) wherein an input bit-stream signal is coupled to a switch located at the output of the amplifier; and (c) wherein the input bit-stream signal is modulated, by the resonator and amplifier disposed within the positive feedback loop, to produce a corresponding output On-Off Keyed (OOK) signal.

24. The regenerative transceiver of any of the embodiments above, further comprising: (a) an output antenna; (b) wherein the output antenna is directly coupled to the output OOK signal.

25. The regenerative transceiver of any of the embodiments above, further comprising means for reconstructing from a received input bit-stream carrier signal a reconstructed transmitted input bit-stream signal.

26. The regenerative transceiver of any of the embodiments above: (a) wherein the amplifier with the gain G is periodically quenched for reception; (b) wherein a received input bit-stream carrier signal is coupled to at least the first electrode; and (c) wherein the means for reconstructing comprises: (i) an output oscillation produced by the resonator and amplifier in the positive feedback loop that corresponds to the received input bit-stream superimposed on the carrier; (ii) an envelope detector that detects an envelope of an output of the transimpedance amplifier; (iii) a comparator that detects when an output of the envelope detector exceeds a threshold voltage $V_{th}$; and (iv) a flip flop that uses an output of the comparator to form a reconstructed transmitted input bit-stream signal.

27. The regenerative transceiver of any of the embodiments above, wherein the electrodes are coupled to the resonant structure by a coupling selected from a group of couplings consisting of: piezoelectric, capacitive, a varactor, and mechanically.

28. The regenerative transceiver of any of the embodiments above, wherein the resonator is tunable to any one of many radio frequency (RF) channels.

29. The regenerative transceiver of any of the embodiments above, wherein the resonant structure is a wine-glass disk resonator.

30. The regenerative transceiver of any of the embodiments above, wherein each resonant structure is selected from a group of resonators consisting of: comb-driven resonators, piezo coupled resonators, ring resonators, contour mode ring resonators, wine-glass disk resonators, wine-glass ring resonators, Lame mode resonators, bar resonators, flexural beam resonators, membrane resonators, comb-driven flexural-mode resonators, center-supported disk resonators, surface acoustic wave (SAW) devices, bulk acoustic wave (BAW) devices, film bulk acoustic resonator (FBAR) devices, lateral overmoded bulk acoustic-wave resonator (LOBAR) devices, piezo actuated resonators, internal dielectric actuated resonators, internally-transduced resonators having a capacitive couple formed from a semiconductor junction, and combinations of the foregoing.

31. The regenerative transceiver of any of the embodiments above, wherein the first and second coupled electrodes are respectively input and output electrodes.

32. The regenerative transceiver of any of the embodiments above, wherein the third and fourth coupled electrodes are respectively feedback input and feedback output electrodes.

33. The regenerative transceiver of any of the embodiments above, wherein the first and second coupled electrodes are differential input electrodes.

34. The regenerative transceiver of any of the embodiments above, wherein the first and second coupled electrodes are coupled to the resonant structure, and wherein the resonant structure rejects input signal components that are off-resonance.

35. A regenerative transceiver, comprising: (a) a resonator, comprising: (i) a resonant structure; (ii) a first electrode coupled to the resonant structure; (iii) a second electrode coupled to the resonant structure; and (b) a positive feedback loop disposed between at least a third and a fourth coupled electrodes.

36. The regenerative transceiver of any of the embodiments above, further comprising an amplifier with a gain G electrically disposed in the positive feedback loop.

37. The regenerative transceiver of any of the embodiments above, wherein the resonator further comprises: (a) a tuning voltage applied to the resonant structure; (b) wherein at least a portion of the resonant structure is biased relative to at least one of the coupled electrodes by the tuning voltage; and (c) wherein a resonant frequency of the resonant structure is changed by varying the tuning voltage.

38. The regenerative transceiver of any of the embodiments above, further comprising an amplifier with a gain G electrically disposed in the positive feedback loop.

39. The regenerative transceiver of any of the embodiments above, wherein the tuning voltage is variable from a minimum voltage $V_{min}$ to a maximum voltage $V_{max}$ that respectively corresponds to a minimum resonant frequency $f_{min}$ to a maximum resonant frequency $f_{max}$ of the resonant structure.

40. The regenerative transceiver of any of the embodiments above, further comprising: (a) an array of two or more resonant structures arranged in parallel in the positive feedback loop; (b) wherein each resonant structure has a designed minimum resonant frequency fmin and a maximum resonant frequency fmax independent of any other parallel resonant structure.

41. The regenerative transceiver of any of the embodiments above: (a) wherein the amplifier is unquenched for transmission; (b) wherein an input bit-stream signal is coupled to at least one resonator input electrode; and (c) wherein one output frequency shift keyed (FSK) signal is modulated by each parallel resonator and the amplifier disposed within the positive feedback loop; and (d) wherein the output frequency shift keyed (FSK) signal corresponds to the input bit-stream signal.

42. The regenerative transceiver of any of the embodiments above, wherein each resonant structure is selected from a group of resonators consisting of: comb-driven resonators, piezo coupled resonators, ring resonators, contour mode ring resonators, wine-glass disk resonators, wine-glass ring resonators, Lame mode resonators, bar resonators, flexural beam resonators, membrane resonators, comb-driven flexural-mode resonators, center-supported disk resonators, surface acoustic wave (SAW) devices, bulk acoustic wave (BAW) devices, film bulk acoustic resonator (FBAR) devices, lateral overmoded bulk acoustic-wave resonator (LOBAR) devices, piezo actuated resonators, internal dielectric actuated resonators, internally-transduced resonators having a capacitive couple formed from a semiconductor junction, and combinations of the foregoing.

43. The regenerative transceiver of any of the embodiments above, wherein the electrodes are coupled to the resonant structure by a coupling selected from a group of couplings consisting of: piezoelectric, capacitive, and piezoresistive.

44. A regenerative transceiver, comprising: (a) a resonator comprising: (i) a resonant structure; (ii) a first electrode coupled to the resonant structure; (iii) a second electrode coupled to the resonant structure; and (b) a negative-resistance amplifier connected to the second electrode.

Although the description herein contains many details, these should not be construed as limiting the scope of the disclosure but as merely providing illustrations of some of the presently preferred embodiments. Therefore, it will be appreciated that the scope of the disclosure fully encompasses other embodiments which may become obvious to those skilled in the art.

In the claims, reference to an element in the singular is not intended to mean "one and only one" unless explicitly so stated, but rather "one or more." All structural, chemical, and functional equivalents to the elements of the disclosed embodiments that are known to those of ordinary skill in the art are expressly incorporated herein by reference and are intended to be encompassed by the present claims. Furthermore, no element, component, or method step in the present disclosure is intended to be dedicated to the public regardless of whether the element, component, or method step is explicitly recited in the claims. No claim element herein is to be construed as a "means plus function" element unless the element is expressly recited using the phrase "means for". No claim element herein is to be construed as a "step plus function" element unless the element is expressly recited using the phrase "step for".

What is claimed is:

1. A regenerative transceiver, comprising:
   (a) a resonator comprising:
      (i) a resonant structure;
      (ii) one or more input electrodes coupled to the resonant structure;
      (iii) two or more output electrodes coupled to the resonant structure;
      (iv) a tuning voltage $V_p$ applied to the resonant structure;
      (v) wherein at least a portion of the resonant structure is biased relative to at least one of the coupled input or output electrodes by the tuning voltage $V_p$; and
      (vi) wherein a resonant frequency f of the resonant structure is changed by varying the tuning voltage $V_p$; and
   (b) a positive feedback loop disposed between at least two of the coupled output electrodes.

2. The regenerative transceiver of claim 1, further comprising an amplifier with a gain G electrically disposed in the positive feedback loop.

3. The regenerative transceiver of claim 1, wherein the resonant frequency f is a fundamental resonant frequency $f_0$ of the resonant structure.

4. The regenerative transceiver of claim 1, wherein the tuning voltage $V_p$ is variable from a minimum voltage $V_{min}$ to a maximum voltage $V_{max}$ that respectively corresponds to a minimum resonant frequency $f_{min}$ to a maximum resonant frequency $f_{max}$ of the resonant structure.

5. The regenerative transceiver of claim 4, further comprising:
   (a) an array of two or more resonant structures arranged in parallel in the positive feedback loop;
   (b) wherein each resonant structure has a designed minimum resonant frequency $f_{min}$ and a maximum resonant frequency $f_{max}$ independent of any other parallel resonant structure.

6. The regenerative transceiver of claim 2:
   (a) wherein the amplifier is unquenched for transmission;
   (b) wherein an input bit-stream signal is coupled to at least one resonator input electrode; and
   (c) wherein the input bit-stream signal is modulated, by the resonator and amplifier disposed within the positive feedback loop, to produce a corresponding output frequency shift keyed (FSK) signal.

7. The regenerative transceiver of claim 6, further comprising:
   (a) an output antenna;
   (b) wherein the output antenna is directly coupled to the output frequency shift keyed (FSK) signal.

8. The regenerative transceiver of claim 2:
   (a) wherein the amplifier is unquenched for transmission;
   (b) wherein an input bit-stream signal is coupled to a switch located at the output of the amplifier;
   (c) wherein the input bit-stream signal is used to modulate an output On-Off Keyed (OOK) signal.

9. The regenerative transceiver of claim 8, further comprising:
   (a) an output antenna;
   (b) wherein the output antenna is directly coupled to the output OOK signal.

10. The regenerative transceiver of claim 2, further comprising means for reconstructing from a received input bit-stream carrier signal a reconstructed transmitted input bit-stream signal.

11. The regenerative transceiver of claim 10:
   (a) wherein the amplifier with the gain G is periodically quenched for reception;
   (b) wherein a received input bit-stream carrier signal is coupled to at least one resonator input electrode; and
   (c) wherein the means for reconstructing comprises:
      (i) an output oscillation produced by the resonator and amplifier positive feedback loop that corresponds to the received input bit-stream superimposed on the carrier;
      (ii) an envelope detector that detects an envelope of an output of the amplifier;
      (iii) a comparator that detects when an output of the envelope detector exceeds a threshold voltage $V_{th}$; and
      (iv) a flip flop that uses an output of the comparator to form a reconstructed transmitted input bit-stream signal.

12. The regenerative transceiver of claim 1, wherein the electrodes are coupled to the resonant structure by a coupling selected from a group of couplings consisting of: piezoelectric, capacitive, and piezoresistive.

13. The regenerative transceiver of claim 1, wherein the resonator is tunable to any one of many radio frequency (RF) channels.

14. The regenerative transceiver of claim 1, wherein the resonant structure is a wine-glass disk resonator.

15. The regenerative transceiver of claim 1, wherein each resonant structure is selected from a group of resonators consisting of: comb-driven resonators, piezo coupled resonators, ring resonators, contour mode ring resonators, wine-glass disk resonators, wine-glass ring resonators, Lame mode resonators, bar resonators, flexural beam resonators, membrane resonators, comb-driven flexural-mode resonators, center-supported disk resonators, surface acoustic wave (SAW) devices, bulk acoustic wave (BAW) devices, film bulk acoustic resonator (FBAR) devices, lateral overmoded bulk acoustic-wave resonator (LOBAR) devices, piezo actuated resonators, internal dielectric actuated resonators, internally-transduced resonators having a capacitive couple formed from a semiconductor junction, and combinations of the foregoing.

16. A regenerative transceiver, comprising:
   (a) a resonator comprising:
      (i) a resonant structure;
      (ii) a first electrode coupled to the resonant structure;
      (iii) a second electrode coupled to the resonant structure; and
      (iv) a tuning voltage applied to the resonant structure;
      (v) wherein at least a portion of the resonant structure is biased relative to at least one of the coupled electrodes by the tuning voltage; and
      (vi) wherein a resonant frequency of the resonant structure is changed by varying the tuning voltage; and
   (b) a positive feedback loop disposed between at least a third and a fourth coupled electrodes.

17. The regenerative transceiver of claim 16, further comprising an amplifier with a gain G electrically disposed in the positive feedback loop.

18. The regenerative transceiver of claim 16, wherein the resonant frequency is a fundamental resonant frequency of the resonant structure.

19. The regenerative transceiver of claim 16, wherein the tuning voltage is variable from a minimum voltage $V_{min}$ to a maximum voltage $V_{max}$ that respectively corresponds to a minimum resonant frequency $f_{min}$ to a maximum resonant frequency $f_{max}$ of the resonant structure.

20. The regenerative transceiver of claim 19, further comprising:
   (a) an array of two or more resonant structures arranged in parallel in the positive feedback loop;
   (b) wherein each resonant structure has a designed minimum resonant frequency $f_{min}$ and a maximum resonant frequency $f_{max}$ different from any other parallel resonant structure; and
   (c) wherein an expanded input bit-stream carrier signal frequency range can be selected by the array.

21. The regenerative transceiver of claim 17:
   (a) wherein the amplifier is unquenched for transmission;
   (b) wherein an input bit-stream signal is coupled to at least the first electrode; and
   (c) wherein the input bit-stream signal is modulated, by the resonator and amplifier disposed within the positive feedback loop, to produce a corresponding output frequency shift keyed (FSK) signal.

22. The regenerative transceiver of claim 21, further comprising:
   (a) an output antenna;
   (b) wherein the output antenna is directly coupled to the output frequency shift keyed (FSK) signal.

23. The regenerative transceiver of claim 17:
   (a) wherein the amplifier is unquenched for transmission;
   (b) wherein an input bit-stream signal is coupled to a switch located at the output of the amplifier; and
   (c) wherein the input bit-stream signal is modulated, by the resonator and amplifier disposed within the positive feedback loop, to produce a corresponding output On-Off Keyed (OOK) signal.

24. The regenerative transceiver of claim 23, further comprising:
   (a) an output antenna;
   (b) wherein the output antenna is directly coupled to the output OOK signal.

25. The regenerative transceiver of claim 17, further comprising means for reconstructing from a received input bit-stream carrier signal a reconstructed transmitted input bit-stream signal.

26. The regenerative transceiver of claim 25:
   (a) wherein the amplifier with the gain G is periodically quenched for reception;
   (b) wherein a received input bit-stream carrier signal is coupled to at least the first electrode; and
   (c) wherein the means for reconstructing comprises:
      (i) an output oscillation produced by the resonator and amplifier in the positive feedback loop that corresponds to the received input bit-stream superimposed on the carrier;
      (ii) an envelope detector that detects an envelope of an output of the transimpedance amplifier;
      (iii) a comparator that detects when an output of the envelope detector exceeds a threshold voltage $V_{th}$; and (iv) a flip flop that uses an output of the comparator to form a reconstructed transmitted input bit-stream signal.

27. The regenerative transceiver of claim 16, wherein the electrodes are coupled to the resonant structure by a coupling selected from a group of couplings consisting of: piezoelectric, capacitive, a varactor, and mechanically.

28. The regenerative transceiver of claim 16, wherein the resonator is tunable to any one of many radio frequency (RF) channels.

29. The regenerative transceiver of claim 16, wherein the resonant structure is a wine-glass disk resonator.

30. The regenerative transceiver of claim 16, wherein each resonant structure is selected from a group of resonators consisting of: comb-driven resonators, piezo coupled resonators, ring resonators, contour mode ring resonators, wine-glass disk resonators, wine-glass ring resonators, Lame mode resonators, bar resonators, flexural beam resonators, membrane resonators, comb-driven flexural-mode resonators, center-supported disk resonators, surface acoustic wave (SAW) devices, bulk acoustic wave (BAW) devices, film bulk acoustic resonator (FBAR) devices, lateral overmoded bulk acoustic-wave resonator (LOBAR) devices, piezo actuated resonators, internal dielectric actuated resonators, internally-transduced resonators having a capacitive couple formed from a semiconductor junction, and combinations of the foregoing.

31. The regenerative transceiver of claim 16, wherein the first and second coupled electrodes are respectively input and output electrodes.

32. The regenerative transceiver of claim 16, wherein the third and fourth coupled electrodes are respectively feedback input and feedback output electrodes.

33. The regenerative transceiver of claim 16, wherein the first and second coupled electrodes are differential input electrodes.

34. The regenerative transceiver of claim 33, wherein the first and second coupled electrodes are coupled to the resonant structure, and wherein the resonant structure rejects input signal components that are off-resonance.

35. A regenerative transceiver, comprising:
(a) a resonator, comprising;
  (i) a resonant structure;
  (ii) a first electrode coupled to the resonant structure;
  (iii) a second electrode coupled to the resonant structure; and
(b) a positive feedback loop disposed between at least a third and a fourth coupled electrodes.

36. The regenerative transceiver of claim 35, further comprising an amplifier with a gain G electrically disposed in the positive feedback loop.

37. The regenerative transceiver of claim 35, wherein the resonator further comprises:
(a) a tuning voltage applied to the resonant structure;
(b) wherein at least a portion of the resonant structure is biased relative to at least one of the coupled electrodes by the tuning voltage; and
(c) wherein a resonant frequency of the resonant structure is changed by varying the tuning voltage.

38. The regenerative transceiver of claim 37, further comprising an amplifier with a gain G electrically disposed in the positive feedback loop.

39. The regenerative transceiver of claim 38, wherein the tuning voltage is variable from a minimum voltage $V_{min}$ to a maximum voltage $V_{max}$ that respectively corresponds to a minimum resonant frequency $f_{min}$ to a maximum resonant frequency $f_{max}$ of the resonant structure.

40. The regenerative transceiver of claim 39, further comprising:
(a) an array of two or more resonant structures arranged in parallel in the positive feedback loop;
(b) wherein each resonant structure has a designed minimum resonant frequency $f_{min}$ and a maximum resonant frequency $f_{max}$ independent of any other parallel resonant structure.

41. The regenerative transceiver of claim 40:
(a) wherein the amplifier is unquenched for transmission;
(b) wherein an input bit-stream signal is coupled to at least one resonator input electrode; and
(c) wherein one output frequency shift keyed (FSK) signal is modulated by each parallel resonator and the amplifier disposed within the positive feedback loop; and
(d) wherein the output frequency shift keyed (FSK) signal corresponds to the input bit-stream signal.

42. The regenerative transceiver of claim 35, wherein each resonant structure is selected from a group of resonators consisting of: comb-driven resonators, piezo coupled resonators, ring resonators, contour mode ring resonators, wine-glass disk resonators, wine-glass ring resonators, Lame mode resonators, bar resonators, flexural beam resonators, membrane resonators, comb-driven flexural-mode resonators, center-supported disk resonators, surface acoustic wave (SAW) devices, bulk acoustic wave (BAW) devices, film bulk acoustic resonator (FBAR) devices, lateral overmoded bulk acoustic-wave resonator (LOBAR) devices, piezo actuated resonators, internal dielectric actuated resonators, internally-transduced resonators having a capacitive couple formed from a semiconductor junction, and combinations of the foregoing.

43. The regenerative transceiver of claim 35, wherein the electrodes are coupled to the resonant structure by a coupling selected from a group of couplings consisting of: piezoelectric, capacitive, and piezoresistive.

44. A regenerative transceiver, comprising:
(a) a resonator comprising;
  (i) a resonant structure;
  (ii) a first electrode coupled to the resonant structure;
  (iii) a second electrode coupled to the resonant structure; and
(b) a negative-resistance amplifier connected to the second electrode.

* * * * *